(12) United States Patent
Modaffari et al.

(10) Patent No.: US 11,637,562 B2
(45) Date of Patent: Apr. 25, 2023

(54) COMPENSATION CIRCUIT FOR DELTA-SIGMA MODULATORS, CORRESPONDING DEVICE AND METHOD

(71) Applicant: STMICROELECTRONICS S.r.l., Agrate Brianza (IT)

(72) Inventors: Roberto Modaffari, Pallanzeno (IT); Paolo Pesenti, Senago (IT); Germano Nicollini, Piacenza (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/677,511

(22) Filed: Feb. 22, 2022

(65) Prior Publication Data
US 2022/0173751 A1 Jun. 2, 2022

Related U.S. Application Data

(63) Continuation of application No. 17/163,230, filed on Jan. 29, 2021, now Pat. No. 11,290,124.

(30) Foreign Application Priority Data

Jan. 31, 2020 (IT) .................... 102020000001918

(51) Int. Cl.
*H03M 3/00* (2006.01)
*H03M 3/02* (2006.01)

(52) U.S. Cl.
CPC ............... *H03M 3/37* (2013.01); *H03M 3/02* (2013.01); *H03M 3/452* (2013.01); *H03M 3/464* (2013.01)

(58) Field of Classification Search
CPC ........ H03M 3/37; H03M 3/464; H03M 3/452; H03M 3/02
USPC .......................................... 341/118, 143, 155
See application file for complete search history.

(56) References Cited

U.S. PATENT DOCUMENTS 8,581,764 B2 * 11/2013 Moue .................... H03M 3/386
341/143
9,513,651 B2 * 12/2016 Ahmed .................. H03M 3/386

OTHER PUBLICATIONS

Benabes et al., "A Methodology for Designing Continuous-Time Sigma-Delta Modulators," Proceedings European Design and Test Conference ED & TC 97, Mar. 17-20, 1997, Paris, France, pp. 46-50.

(Continued)

*Primary Examiner* — Khai M Nguyen
(74) *Attorney, Agent, or Firm* — Seed Intellectual Property Law Group LLP

(57) ABSTRACT

A delta-sigma modulation circuit has a sampling period and, in operation, generates a delta-sigma modulated signal based on the analog input signal. The delta-sigma modulation circuit includes: a first integrator; an analog-to-digital converter; a feedback-loop coupled between an input of the first integrator and the output interface; a second integrator coupled between the first integrator and the analog-to-digital converter. The delta-sigma modulation circuit has loop-delay compensation circuitry having a plurality of switches. The loop delay compensation circuitry, in operation, controls the plurality of switches based on a time interval of a duration of half the sampling period and generates a loop-delay compensation signal.

24 Claims, 13 Drawing Sheets

(56) References Cited

OTHER PUBLICATIONS

Keller et al, "Comparative Study on Excess-Loop-Delay Compensation Techniques for Continuous-Time Sigma-Delta Modulators," *IEEE Transactions on Circuits and Systems—I: Regular Papers* 55(11):3480-3487, 2008.

Mitteregger et al., "A 20-mW 640-MHz CMOS Continuous-Time ΣΔ ADC With 20-MHz Signal Bandwidth, 80-dB Dynamic Range and 12-bit ENOB," *IEEE Journal of Solid-State Circuits* 41(12):2641-2649, 2006.

Pavan et al., "A Power Optimized Continuous-Time ΣΔ ADC for Audio Applications," *IEEE Journal of Solid-State Circuits* 43(2):351-360, 2008.

Vadipour et al., "A 2.1mW/3.2mW Delay-Compensated GSM/WCDMA ΣΔ Analog-Digital Converter," IEEE Symposium on VLSI Circuits, Jun. 18-20, 2008, Honolulu, Hawaii, pp. 180-181.

Weng et al., "A 0.89-mW I-MHz 62-dB SNDR Continuous-Time Delta-Sigma Modulator With an Asynchronous Sequential Quantizer and Digital Excess-Loop-Delay Compensation," *IEEE Transactions on Circuits and Systems—II: Express Briefs* 58(12):867-871, 2011.

\* cited by examiner

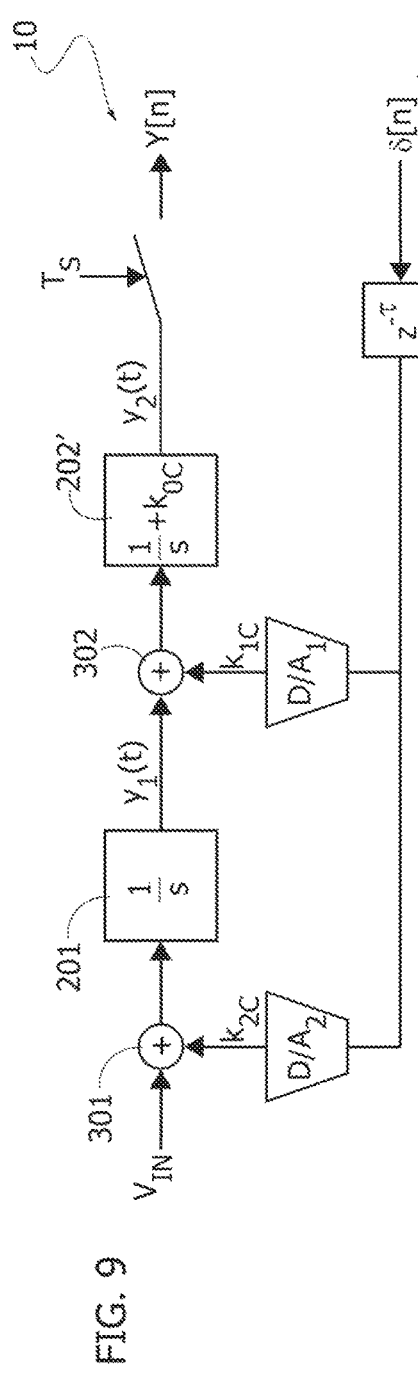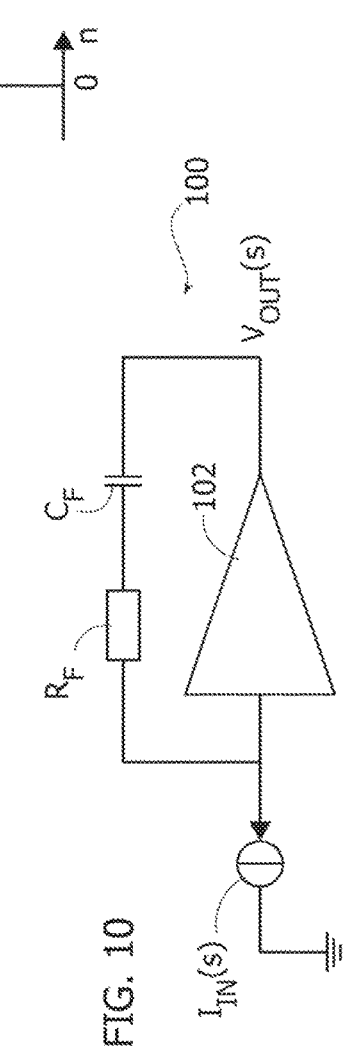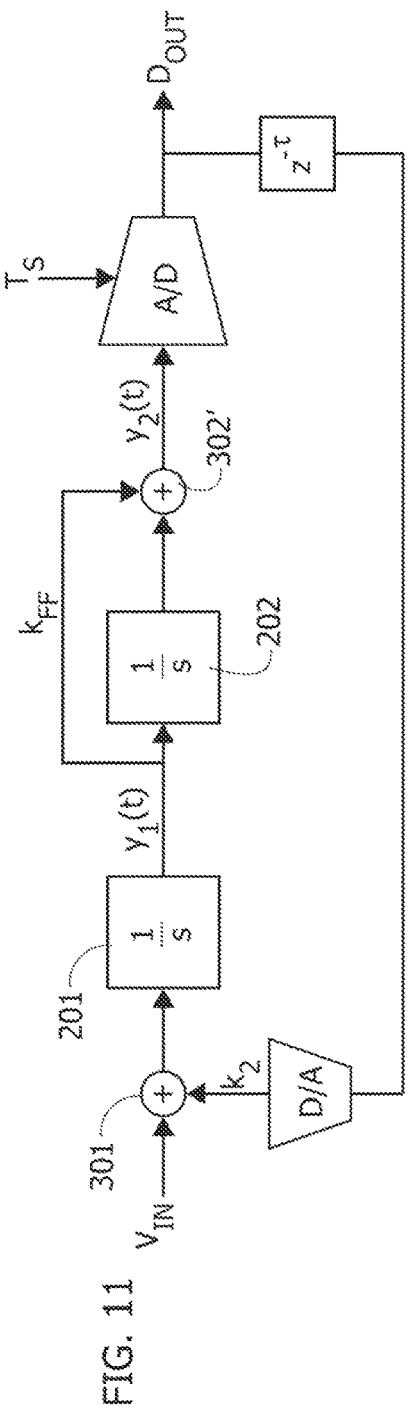
FIG. 9
FIG. 10
FIG. 11

COMPENSATION CIRCUIT FOR DELTA-SIGMA MODULATORS, CORRESPONDING DEVICE AND METHOD

BACKGROUND

Technical Field

The description relates to compensation circuits.

One or more embodiments may be applied, for instance, to compensation of excess loop delay in continuous-time delta-sigma modulators.

Description of the Related Art

Intrinsic anti-alias filter, large input-signal bandwidth, low noise and reduced power consumption have contributed to the popularity of continuous-time delta-sigma modulators (CTDSM) in the past two decades.

Many design examples have been reported in the literature addressing a variety of applications and proving the versatility of such high-performance ADCs.

Thanks to this popularity, large efforts have been devoted to investigating CTDSM non-idealities and techniques to deal with them.

Excess loop delay (ELD), which may result in severe performance degradation up to modulator instability, is exemplary of an issue of concern for practically all CTDSMs.

BRIEF SUMMARY

One or more embodiments may provide an improved circuit for compensating excess loop delay (ELD) in continuous-time delta-sigma modulators (briefly CTDSMs).

In comparison with conventional approaches, which may be suitable for use in all CTDSM topologies (at the expense of a complex hardware required) or adopt simple hardware arrangements (at the expense of being limited to certain CTDSM topologies) one or more embodiments may provide solutions which, while relying on otherwise simple hardware, may be suitable for use in notionally all CTDSM topologies.

In an embodiment, a circuit comprises: an input node configured to receive an analog input signal; a quantizer circuit having an output node, the quantizer circuit operable at a sampling period and configured to provide at the output node a digital signal based on analog-to-digital conversion of the analog input signal received at the input node; a first integrator circuit in a signal propagation path from the input node to the quantizer circuit, the first integrator circuit having an input coupled to the input node; a feedback network sensitive to the digital signal at the output node, the feedback network having a digital-to-analog converter configured to inject into the input of the first integrator circuit a weighted analog-converted replica of the digital output signal, wherein the first integrator circuit propagates over the signal propagation path towards the quantizer circuit an integrated signal which is a function of the analog input signal and the weighted analog-converted replica of the digital output signal; an excess delay loop compensation network comprising a derivative circuit configured to receive a weighted replica of the integrated signal from the first integrator circuit and produce therefrom a derivative signal as well as a sign-reversal circuit configured to alternately reverse the sign of the derivative signal over subsequent time intervals of a duration of half the sampling period; integration circuitry configured to integrate the derivative signal having the sign thereof alternately reversed over the subsequent time intervals of a duration of half the sampling period; and an excess delay loop compensation node configured to inject into the signal propagation path towards the quantizer circuit an excess delay loop compensation signal, wherein: the excess delay loop compensation node is coupled to an output of the integration circuitry and is configured to inject into the signal propagation path towards the quantizer circuit the derivative signal having the sign thereof alternately reversed over the subsequent time intervals of a duration of half the sampling period after integration of the derivative signal at the integration circuitry; or the excess delay loop compensation node is coupled to an input of the integration circuitry and is configured to inject into the signal propagation path towards the quantizer circuit the derivative signal having the sign thereof alternately reversed over the subsequent time intervals of a duration of half the sampling period before integration of the derivative signal at the integration circuitry. In an embodiment, the integration circuitry comprises: a second integrator circuit coupled between the sign-reversal circuit and the excess delay loop compensation node; and a third integrator circuit coupled between the first integrator circuit and the excess delay loop compensation node, wherein the derivative signal having the sign thereof alternately reversed over the subsequent time intervals of a duration of half the sampling period is injected after integration at the second integrator circuit into the signal propagation path towards the quantizer circuit downstream of the third integrator circuit. In an embodiment, the feedback network sensitive to the digital signal at the output node comprises a second digital-to-analog converter configured to inject into the signal propagation path towards the quantizer circuit between the first integrator circuit and the third integrator circuit a second weighted analog-converted replica of the digital output signal. In an embodiment, the circuit comprises a feedforward signal path coupled to the first integrator circuit to receive the integrated signal, the feedforward signal path configured to inject a weighted replica of the integrated signal into the signal propagation path towards the quantizer circuit intermediate the second further integrator circuit and the quantizer circuit. In an embodiment, the integration circuitry comprises a second integrator circuit coupled between the excess delay loop compensation node and the quantizer circuit wherein the derivative signal having the sign thereof alternately reversed over the subsequent time intervals of a duration half the certain sampling period is injected into the signal propagation path towards the quantizer circuit upstream of the second integrator circuit. In an embodiment, the feedback network sensitive to the digital signal at the output node comprises a second digital-to-analog converter configured to inject into the signal propagation path towards the quantizer circuit between the first integrator circuit and the second integrator circuit a second weighted analog-converted replica of the digital output signal. In an embodiment, the circuit comprises a feedforward signal path coupled to the first integrator circuit to receive the integrated signal, the feedforward signal path configured to inject a weighted replica of the integrated signal into the signal propagation path towards the quantizer circuit between the second integrator circuit and the quantizer circuit. In an embodiment, the first integrator circuit comprises a fully differential amplifier having differential input node terminals and differential output node terminals with resistor/capacitor (RC) feedback networks coupled between the differential output node terminals and the differential input node terminals. In an embodiment, the second integrator circuit comprises a fully differential amplifier having differential input node terminals and differential output node terminals with RC feedback networks coupled between the differential output node terminals and the differential input node terminals, wherein the RC feedback networks of the second integrator circuit provide virtual ground nodes of the second integrator circuit, and the differential output node terminals of the first integrator circuit are coupled to the virtual ground nodes of the second integrator circuit via respective capacitances providing the derivative circuit and via sign-reversal circuitry configured to alternately reverse over subsequent time intervals of a duration of half the sampling period the polarity of coupling the respective capacitances to the virtual ground nodes in the second integrator circuit.

In an embodiment, a system comprises: an input interface, which, in operation, receives an analog input signal; an output interface, which, in operation, outputs a delta-sigma modulated signal; and a delta-sigma modulation circuit having a sampling period and coupled between the input interface and the output interface, wherein the delta-sigma modulation circuit, in operation, generates the delta-sigma modulated signal based on the analog input signal, the delta-sigma modulation circuit including: a first integrator; an analog-to-digital converter coupled to the output interface; a feedback-loop coupled between an input of the first integrator and the output interface; a second integrator coupled between the first integrator and the analog-to-digital converter; and loop-delay compensation circuitry having a plurality of switches, wherein the loop delay compensation circuitry, in operation, controls the plurality of switches based on a time interval of a duration of half the sampling period and generates a loop-delay compensation signal. In an embodiment, the loop-delay compensation circuitry includes a derivative circuit coupled between an output of the first integrator and the plurality of switches. In an embodiment, the loop-delay compensation circuitry comprises a third integrator coupled to an output of the plurality of switches. In an embodiment, the feedback-loop includes: a first adder having a first input coupled to the input interface and an output coupled to an input of the first integrator; a first digital-to-analog converter coupled between the output interface and a second input of the first adder; a second adder having a first input coupled to an output of the first integrator and an output coupled to an input of the second integrator; and a second digital-to-analog converter coupled between the output interface and a second input of the second adder; and the loop-delay compensation circuitry comprises a third adder having a first input coupled to an output of the second integrator, a second input coupled to an output of the third integrator and an output coupled to the analog-to-digital converter. In an embodiment, the first digital-to-analog converter, in operation, generates a first weighted feedback signal; and the second digital-to-analog converter, in operation, generates a second weighted feedback signal. In an embodiment, the feedback-loop includes: a first adder having a first input coupled to the input interface and an output coupled to an input of the first integrator; and a first digital-to-analog converter coupled between the output interface and a second input of the first adder; and the loop-delay compensation circuitry comprises a second adder having a first input coupled to an output of the second integrator, a second input coupled to an output of the third integrator and an output coupled to the analog-to-digital converter. In an embodiment, the first digital-to-analog converter, in operation, generates a first weighted feedback signal. In an embodiment, the delta-sigma modulation circuit includes a third adder coupled between the output of the second integrator and the second adder, the third adder having a first input coupled to an output of the first integrator, a second input coupled to the output of the second integrator and an output coupled to the first input of the second adder. In an embodiment, the delta-sigma modulation circuit comprises an inverter coupled between the output of the first integrator and the first input of the third adder. In an embodiment, the feedback-loop includes: a first adder having a first input coupled to the input interface and an output coupled to an input of the first integrator; a first digital-to-analog converter coupled between the output interface and a second input of the first adder; a second adder having a first input coupled to an output of the first integrator and an output coupled to an input of the second integrator; and a second digital-to-analog converter coupled between the output interface and a second input of the second adder; and an output of the loop-delay compensation circuitry is coupled to a third input of the second adder. In an embodiment, the first digital-to-analog converter, in operation, generates a first weighted feedback signal; and the second digital-to-analog converter, in operation, generates a second weighted feedback signal. In an embodiment, the feedback-loop includes: a first adder having a first input coupled to the input interface and an output coupled to an input of the first integrator; and a first digital-to-analog converter coupled between the output interface and a second input of the first adder; and the delta-sigma modulation circuit includes: a second adder having a first input coupled to an output of the first integrator, a second input coupled to an output of the loop-delay compensation circuitry, and an output coupled to the second integrator; and a third adder having a first input coupled to an output of the first integrator, a second input coupled to an output of the second integrator and an output coupled to the analog-to-digital converter. In an embodiment, the first digital-to-analog converter, in operation, generates a first weighted feedback signal. In an embodiment, the delta-sigma modulation circuit comprises an inverter coupled between the output of the first integrator and the first input of the third adder. In an embodiment, the first integrator comprises a first differential amplifier; and the second integrator comprises a second differential amplifier. In an embodiment, the first differential amplifier has differential input node terminals and differential output node terminals with resistor/capacitor (RC) feedback networks coupled between the differential output node terminals and the differential input node terminals. In an embodiment, the second differential amplifier has differential input node terminals and differential output node terminals with RC feedback networks coupled between the differential output node terminals and the differential input node terminals, wherein the RC feedback networks of the second differential amplifier, in operation, provide virtual ground nodes; and the differential output node terminals of the first differential amplifier are coupled to the virtual ground nodes of the second differential amplifier via respective capacitances and switches of the plurality of switching circuits.

In an embodiment, a method, of providing at an output node a digital signal resulting from analog-to-digital conversion of an analog input signal supplied to an input node, comprises: supplying the analog input signal to the input node; providing the digital signal to the output node via a quantizer circuit operated with a sampling period; providing a signal propagation path from the input node to the quantizer circuit the signal propagation path comprising a first integrator circuit having an input coupled to the input node to receive the analog input signal; providing a feedback network sensitive to the digital signal at the output node, the feedback network comprising an digital-to-analog converter configured to inject into the input of the first integrator circuit a weighted analog-converted replica of the digital output signal, wherein the first integrator circuit propagates over the signal propagation path towards the quantizer circuit an integrated signal which is a function of the analog input signal and the weighed analog-converted replica of the digital output signal; receiving the integrated signal from the at least one integrator circuit at a derivative circuit configured to produce therefrom a derivative signal and alternately reversing a sign of the derivative signal over subsequent time intervals of a duration of half the sampling period; providing at least one further integrator circuit configured to integrate the derivative signal having the sign thereof alternately reversed over the subsequent time intervals of a duration of half the sampling period; injecting into the signal propagation path towards the quantizer circuit an excess delay loop compensation signal, wherein the injecting comprises: injecting into the signal propagation path towards the quantizer circuit the derivative signal having the sign thereof alternately reversed over the subsequent time intervals of a duration of half the sampling period after integration of the derivative signal at the at least one further integrator circuit; or injecting into the signal propagation path towards the quantizer circuit the derivative signal having the sign thereof alternately reversed over the subsequent time intervals of a duration of half the sampling period before integration of the derivative signal at the at least one further integrator circuit.

In an embodiment, a method comprises: receiving an analog input signal; and generating a digital delta-sigma modulated signal using a sampling period, wherein the generating the digital delta-sigma modulated signal includes: generating a feed-back signal based on the digital delta-sigma modulated signal; combining the feedback signal with the analog input signal, generating a difference signal; integrating the difference signal; generating a loop-delay compensation signal based on the integrated signal by controlling a plurality of switches based on a time interval of a duration of half the sampling period; and generating a intermediate signal based on the integrated signal and the loop-delay compensation signal; and sampling the intermediate signal using the sampling period, generating the digital delta-sigma modulated signal. In an embodiment, generating the loop-delay compensation signal includes generating a derivative of the integrated difference signal. In an embodiment, the method comprises: generating a second feed-back signal based on the digital delta-sigma modulated signal; and combining the second feedback signal with integrated difference signal; integrating the combined second feedback signal and integrated difference signal, generating a second intermediate signal; and generating the intermediate signal by combining the second intermediate signal and the loop-delay compensation signal. In an embodiment, the method comprises: integrating the integrated difference signal, generating a second integrated signal; combining the integrated difference signal and the second integrated signal, generating a second intermediate signal; and combining the second intermediate signal and the loop-delay compensation signal, generating the intermediate signal. In an embodiment, the method comprises: generating a second feed-back signal based on the digital delta-sigma modulated signal; combining the second feedback signal with integrated difference signal and the loop-delay compensation signal, generating a second intermediate signal; and generating the intermediate signal by integrating the second intermediate signal. In an embodiment, the method comprises: combining the integrated difference signal and the loop-delay compensation signal; integrating the combined integrated difference signal and loop-delay compensation signal, generating a second intermediate signal; and generating the intermediate signal by combining the second intermediate signal and the integrated difference signal. In an embodiment, the method comprises: integrating the difference signal using a first differential amplifier; generating a second feed-back signal based on the digital delta-sigma modulated signal; generating a second intermediate signal based on the integrated difference signal, the loop-delay compensation signal and the second feed-back signal; and generating the intermediate signal by integrating the second intermediate signal using a second differential amplifier.

BRIEF DESCRIPTION OF THE SEVERAL VIEWS OF THE DRAWINGS

One or more embodiments will now be described, by way of example only, with reference to the annexed figures, wherein:

FIG. 9 is a block diagram exemplary of another possible approach in countering ELD;

FIG. 10 is a block diagram of an integrator;

FIGS. 11 and 12 are block diagrams useful in discussing certain principles underlying certain embodiments as per the instant description;

DETAILED DESCRIPTION

In the following description, various specific details are given to provide a thorough understanding of various exemplary embodiments of the present specification. The embodiments may be practiced without one or several specific details, or with other methods, components, materials, etc. In other instances, well-known structures, materials, or operations are not shown or described in detail in order to avoid obscuring various aspects of the embodiments. Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The headings/references provided herein are for convenience only, and therefore do not interpret the extent of protection or scope of the embodiments.

Figure 1:
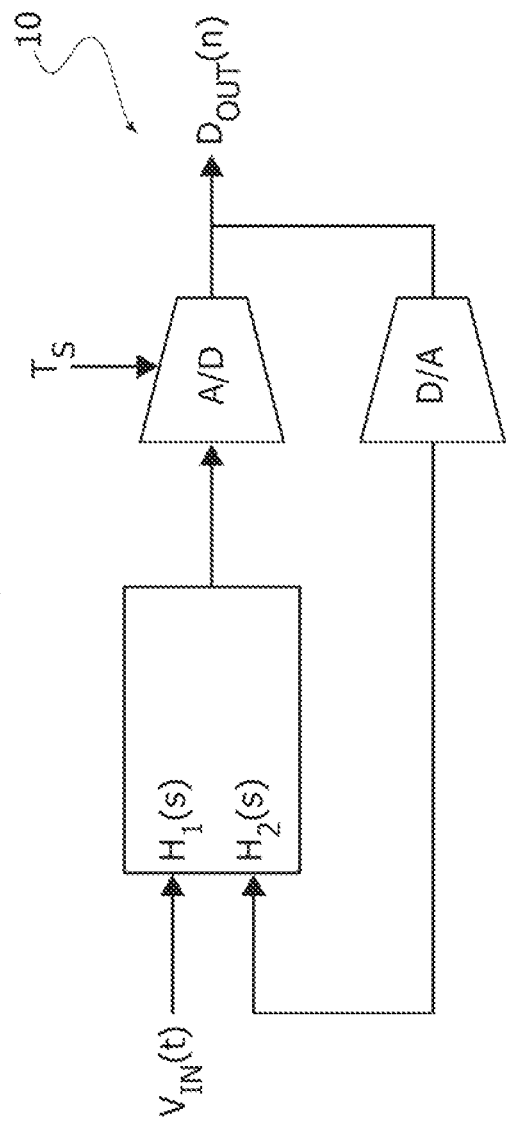
FIG. 1 is a general block diagram of a conventional delta-sigma converter.

A block diagram of a conventional delta-sigma analog-to-digital converter (ADC) 10 is presented in FIG. 1, where $H_1(s)$ denotes the transfer function (TF) of an input loop filter (LF) supplied with an analog input signal $V_{IN}(t)$.

The block designated A/D represents a quantizer clocked at a period $T_S$ which generates a (time-discrete) digital output signal $D_{OUT}[n]$.

The block designated D/A represents a digital-to-analog converter (briefly, DAC) which is sensitive to the digital output signal $D_{OUT}[n]$, re-converts that digital signal to analog and supplied the analog re-converted signal to a feedback loop filter transfer function $H_2(s)$.

As noted, such an arrangement is conventional in the art, which makes it unnecessary to provide a more detailed description herein.

Also, throughout this description, unless the context indicates otherwise:
like parts or elements will be indicated in the figures with like reference symbols, so that a related description will not be unnecessarily repeated;
a same designation ($V_{IN}$, or $D_{OUT}$, for instance) will be used for simplicity to refer both to a certain signal and to a circuit node/element at which such a signal may be present, and
the designation "adder node" will be applied to certain circuit nodes where two or more signals are added together: as known to those of skill in the art, such nodes can be "with sign", namely nodes where a certain signal is added with one or more other signals with a negative sign, that is subtracted from the combination. Stated otherwise, designating a node as an adder node does not imply that the signals added at that node are added with a same sign.

Figure 2:
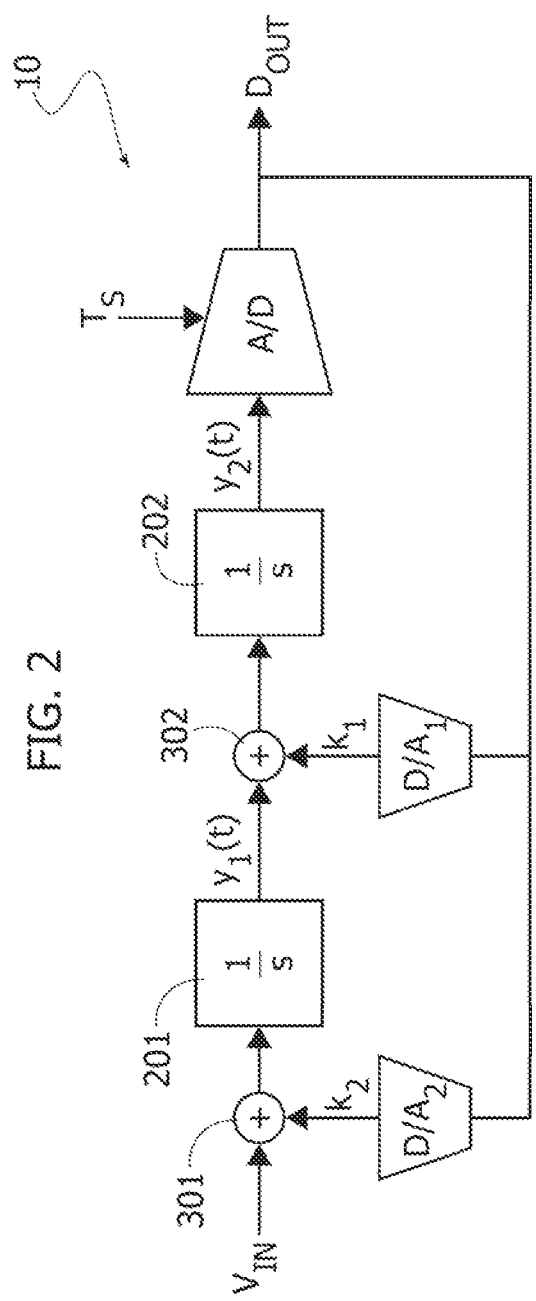
FIG. 2 is a block diagram of an exemplary implementation of a converter as illustrated in FIG. 1.

FIG. 2 is a block diagram exemplary of a possible implementation of an arrangement 10 as exemplified in FIG. 1 in the form of a second-order CIFB (cascade of integrator with feedback) modulator, suited to be implemented using a fully-differential topology, for instance.

The following designations apply in the diagram of FIG. 2:
$V_{IN}$=(analog) input signal;
$y_1(t)$=output from a first integrator (1/s) 201 supplied with the addition, obtained at a first node 301, of the input signal $V_{IN}$ and a feedback term obtained from $D_{OUT}$ via a DAC D/A$_2$ multiplied by a coefficient $k_2$ (for simplicity, this can be assumed to be included in the DAC); as discussed previously, the node 301 can be an adder node "with sign", where the feedback term obtained via a DAC D/A$_2$ weighed by $k_2$ is in fact subtracted from the input signal $V_{IN}$ as conventional in a delta-sigma modulator;
$y_2(t)$=output from a second integrator (1/s) 202 supplied with the combination, obtained at a second adder node 302, of the output $y_1(t)$ from the first integrator 201 and a feedback term obtained from $D_{OUT}$ via a DAC D/A$_1$ multiplied by a coefficient $k_1$ which (again for simplicity, this can be assumed to be included in the DAC and/or have associated a negative sign); and
$D_{OUT}$=modulator output obtained by sampling the signal $y_2(t)$ at a quantizer A/D with a sampling period $T_S$.

In the exemplary structure of FIG. 2, two DACs, D/A$_1$ and D/A$_2$, are used to implement two feedback coefficients $k_1$, $k_2$ (this is essentially what is indicated as $H_2(s)$ in FIG. 1).

For simplicity of explanation and without loss of generality, one may assume $T_S$=1s as an exemplary sampling period plus $k_1$=1.5 $k_1$=1.5 and $k_2$=1 as the feedback coefficients, this resulting in a Noise Transfer Function (NTF) for the modulator 10 in the form:

$$NTF(z)=(1-z^{-1})^2$$

Figure 3:
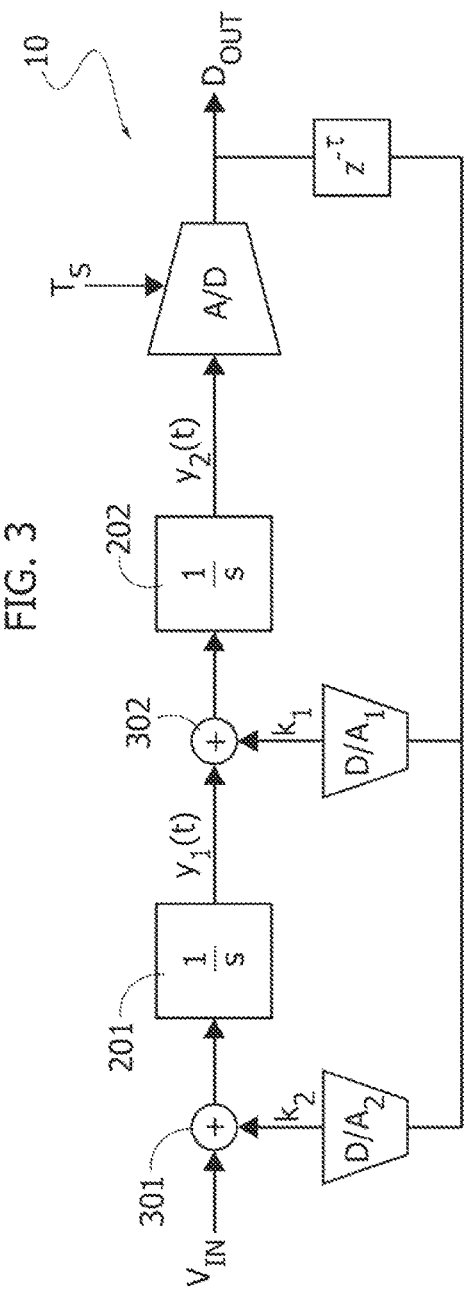
FIG. 3 is a block diagram exemplary of excess loop delay (ELD) affecting a circuit as exemplified in FIG. 2.

FIG. 3 is an exemplary representation of the phenomenon currently referred to as excess loop delay (ELD) which, as already discussed in the foregoing, may affect a circuit as exemplified in FIG. 2.

As discussed, throughout this description, unless the context indicates otherwise, like parts or elements will be indicated in the figures with like reference symbols and a description of parts or elements already described will not be repeated for each and every figure. In FIG. 3 the effect of excess loop delay is represented as a delay block $z^{-\tau}$ in the feedback signal path from the output $D_{OUT}$ to the inputs to the two DACs, D/A$_1$ and D/A$_2$.

Figure 4:
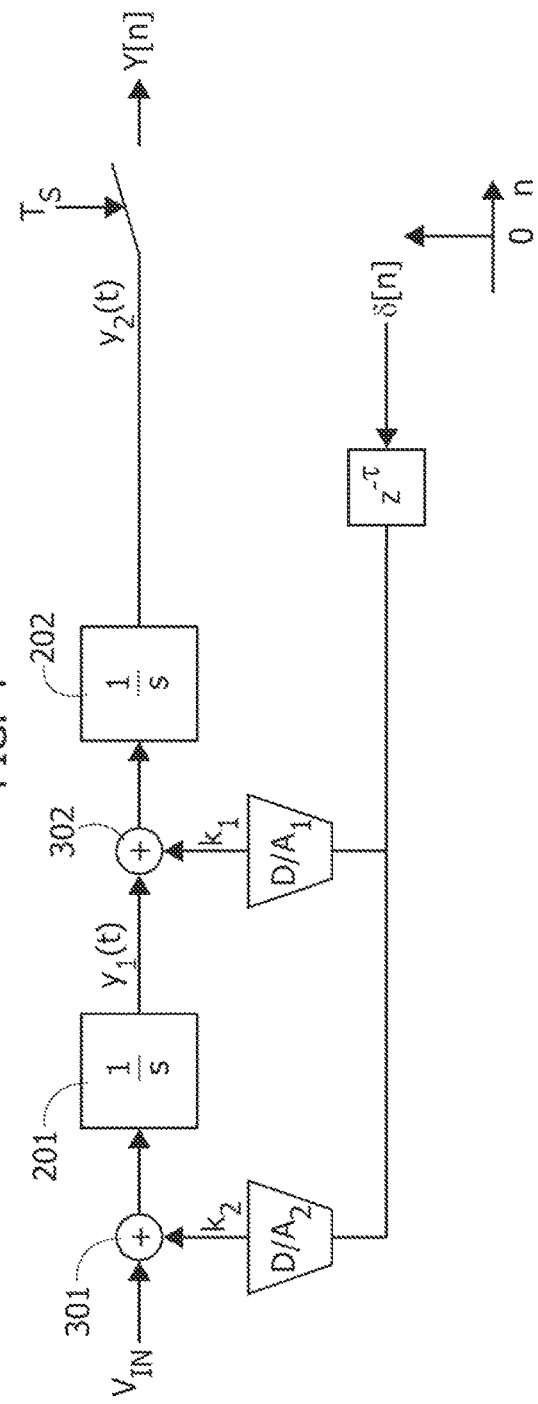
FIG. 4 is a block diagram exemplary of an approach in evaluating the effects of ELD in a circuit as exemplified in FIGS. 2 and 3.

A practical way of representing the impact of ELD on the impulse response IR of an arrangement as exemplified in FIGS. 2 and 3 is shown in the block diagram of FIG. 4. There, an "open loop" condition is assumed where the quantizer A/D is disconnected and an ideal (time-discrete) digital impulse $\delta(n)$ is applied to the inputs of the two DACs, D/A$_1$ and D/A$_2$ with a "normalized" delay r applied thereto.

Figure 5:
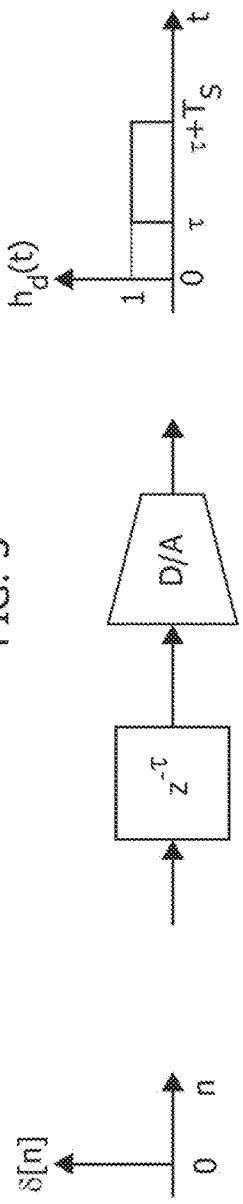
FIG. 5 is exemplary of an approach in modelling ELD in a digital-to-analog (DAC) converter.

Referring for simplicity to the (otherwise common) case of No-Return-to-Zero (NRZ) DACs, the output of each DAC, namely D/A$_1$ and D/A$_2$, will be a delayed rectangular pulse whose length equals the sampling period $T_S$ as exemplified in FIG. 5.

One may then assume that, in a system as exemplified in FIGS. 2 and 3 (with the effect of ELD modeled by a delay block $z^{-\tau}$ as in FIGS. 3 and 4), the delayed pulse from each DAC pulse is injected in the loop filter weighted with the corresponding coefficient $k_1$ or $k_2$ as exemplified in FIG. 4 (which can be generalized to the case of a n-th order modulator with a number n of different DACs D/A$_1$, D/A$_2$, ..., D/A$_n$ and respective coefficients $k_1, k_2, ..., k_n$).

Figure 6:
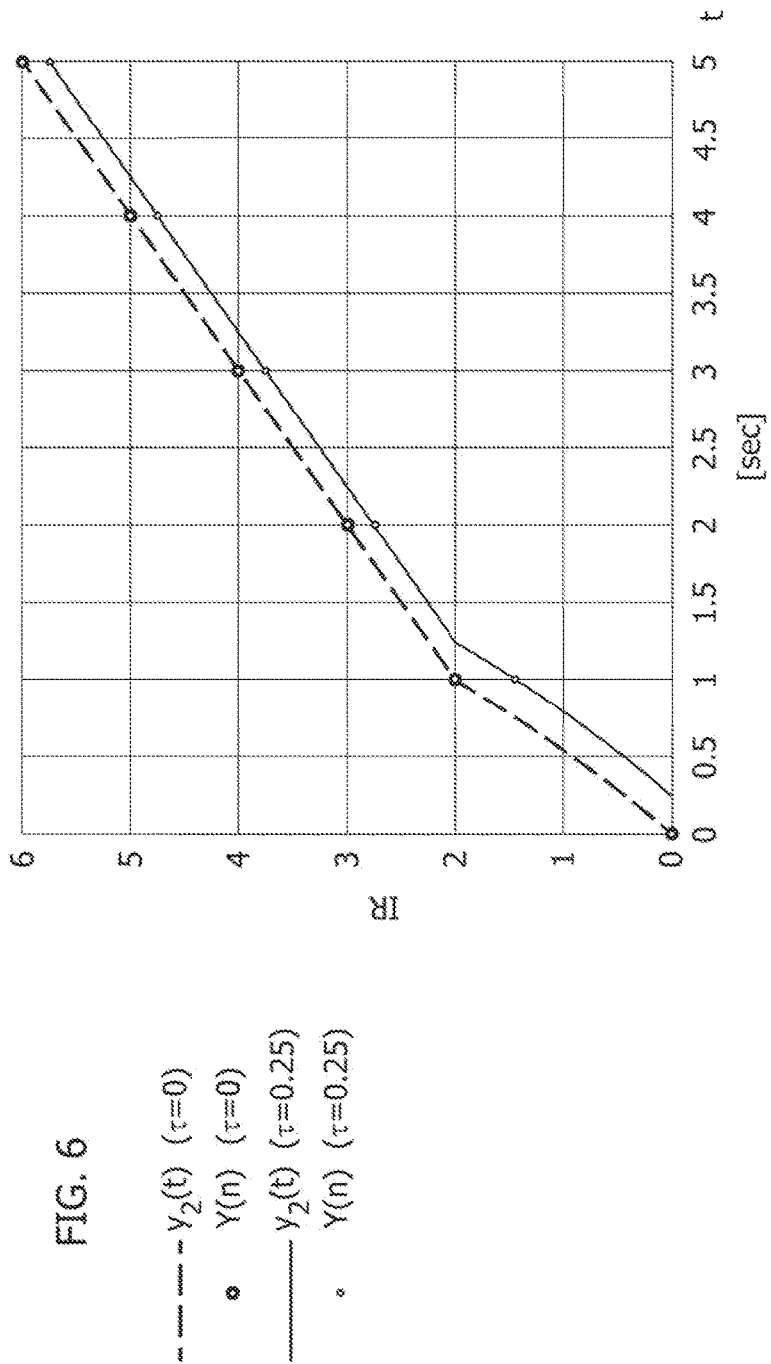
FIG. 6 is a diagram exemplary of possible effects of ELD in a circuit as exemplified in FIGS. 2 and 3.

In the exemplary case considered herein of a second order CTDSM, the effect of ELD on the behavior (impulse response or IR) of the circuit can be assessed as illustrated in FIG. 6.

There, the output signal $y_2(t)$ from the second integrator is plotted as a function of time for $\tau$=0 (ideal behavior, dashed line) and $\tau$=0.25 (ELD-affected impulse response, continuous line) together with sampled versions spaced by the sampling period $T_S$ highlighted by dots.

FIG. 6 shows that ELD causes an alteration of the impulse response IR of the system resulting in modulator performance degradation.

Various ELD compensation techniques have been proposed in order to address that drawback.

For instance, B. Benabes, M. Keramat and R. Kielbasa in: "A methodology for designing continuous-time sigma-delta modulators", in *Proc. Eur. Des. Test Conf.*, vol. 1, pp. 46-50, 1197 disclose an ELD compensation approach which involves tuning the loop filter coefficients $k_{1C}$, $k_{2C}$ (which correspond to $k_1$, $k_2$ discussed previously) and introducing a direct feedback path via a further DAC, namely D/A$_0$ closed with an associated coefficient $k_{0C}$ on the quantizer as exemplified in FIG. 7. There, the quantizer D/A is shown supplied with a signal $y_3(t)$ obtained by combining at an adder node 303 at the output of the second integrator 202 the signal $y_2(t)$ with the signal from D/A$_0$ with an associated coefficient $k_{0C}$.

It is again noted that, throughout this description, unless the context indicates otherwise, like parts or elements are indicated with like reference symbols so that a related description will not be unnecessarily repeated for brevity.

Figure 7:
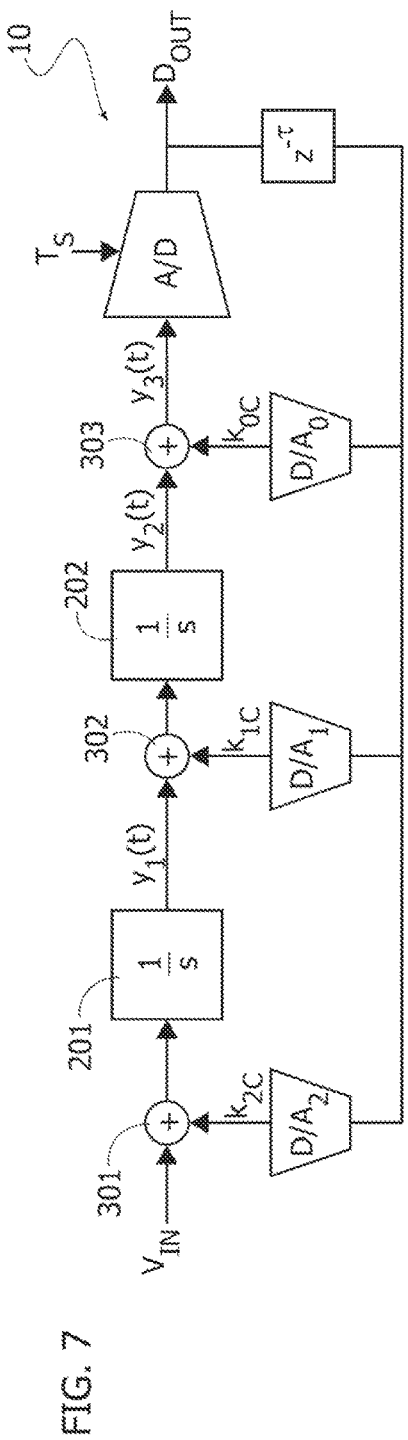
FIG. 7 is a block diagram exemplary of a possible approach in countering ELD.
Figure 8:
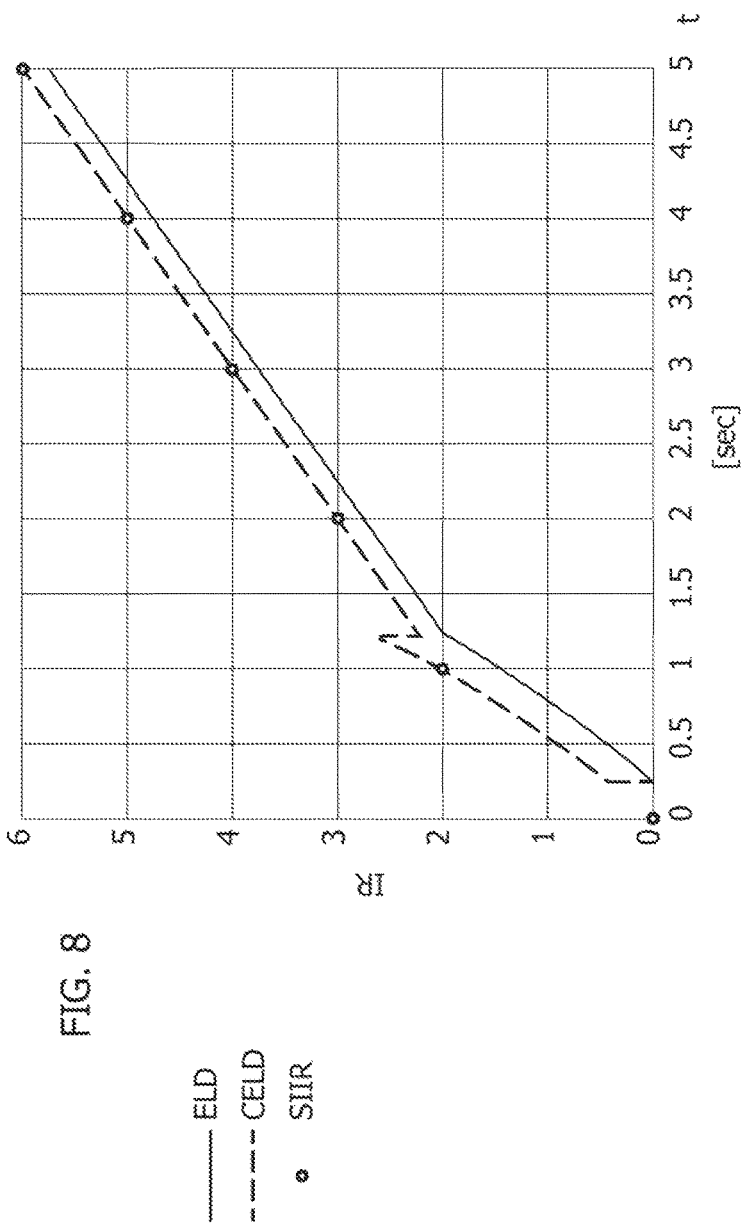
FIG. 8 is a diagram, similar to the diagram of FIG. 6, exemplary of possible results in countering ELD with the approach of FIG. 7.

A solution as exemplified in FIG. 7 facilitates ELD compensation as exemplified in FIG. 8 where an ELD-affected impulse response (ELD—continuous line) as already presented in FIG. 6 is portrayed against an ELD-compensated (CELD—dashed line) together with samples SIIR of the "ideal" impulse response IR spaced by the sampling period $T_S$ highlighted by dots.

Such a result is however at the expense of an extra DAC (D/A$_0$ in FIG. 7) and an associated additional summing amplifier for the node 303. This may be expensive in terms of area and current consumption, which makes such a solution hardly appealing for low-power designs.

The diagram of FIG. 9 (where parts or elements already discussed are again indicated with like reference symbols and are not described for brevity) is exemplary of an alternative approach that avoids the introduction of expensive extra-hardware in compensating ELD by resorting to a PI (proportional-integral) element as discussed in M. Keller, A. Buhmann, J. Sauerbrey, M. Ortmanns and Y. Manoli, "A Comparative Study on Excess-Loop-Delay Compensation Techniques for Continuous-Time Sigma-Delta Modulators", *IEEE Transaction on Circuits and Systems—I: Regular Papers*, vol. 55, no. 11, pp. 3480-3487, December 2008.

In such a solution (as disclosed in M. Vadipour et al., "A 2.1 mW/3.2 mW Delay-Compensated GSM/WCDMA sigma-delta Analog-Digital converter", in *Proc. IEEE Symp. VLSI circuits*, pp 180-181, 2008) the coefficient $k_{0C}$ is "embedded" in a modified second integrator 202".

In that way, the inner loop coefficient $k_{1C}$ may concur with the proportional path represented by the coefficient $k_{0C}$ in providing a contribution to the impulse response IR of the system whose effect is the same of the direct feedback loop presented in Benabes et al. (already cited)—see FIG. 7.

A possible implementation of this concept may involve using a resistor $R_F$ in series to an integrating capacitance $C_F$ in the feedback loop of an otherwise conventional integrator 100 constructed around an amplifier (an OpAmp, for instance) 102 as exemplified in FIG. 10. Such an integrator circuit, providing an integrated output voltage $V_{OUT}(s)$ as a function of an input current $I_{IN}(s)$ can be used in the second (active) integrator in a diagram as exemplified in FIG. 9 to embed therein a proportional path with (very) simple hardware.

It is noted that a loop as exemplified in FIG. 9 provides effective compensation. Removing an (inner) loop as in the case of single-loop architectures definitely militates against using a solution as proposed by Vadipour et al. (as cited previously).

There, a feedforward path with a weighing coefficient $k_{FF}$ is introduced around the second integrator 202 to facilitate loop stability saving one feedback DAC. As a result, effectively compensating ELD in an architecture as shown in FIG. 11 involves resorting to the solution of Benabes et al. (already repeatedly cited), at the expense of extra DAC associated with the quantizer.

It is otherwise noted that compensating ELD in a CTDSM does not involve reshaping the delayed impulse response (IR) to match the ideal IR at each every instant: indeed, a satisfactory result can be achieved acting (even) just when the curves are sampled by the quantizer.

One or more embodiments provide an ELD compensation approach which facilitates addressing the limitations of the solutions discussed in the foregoing, by facilitating ELD compensation in notionally any loop filter topology, with the use of (much) simpler hardware than an extra DAC and an associated summing amplifier. For instance, one or embodiments may involve using a pair of capacitances and four switches.

By way of introduction to a detailed description of exemplary embodiments, one may note that ELD compensation schemes as discussed previously are based on a proper tuning of loop coefficients and on the introduction of a term whose value is not null (non-zero) only when the DAC output is not null (non-zero).

Figure 12:
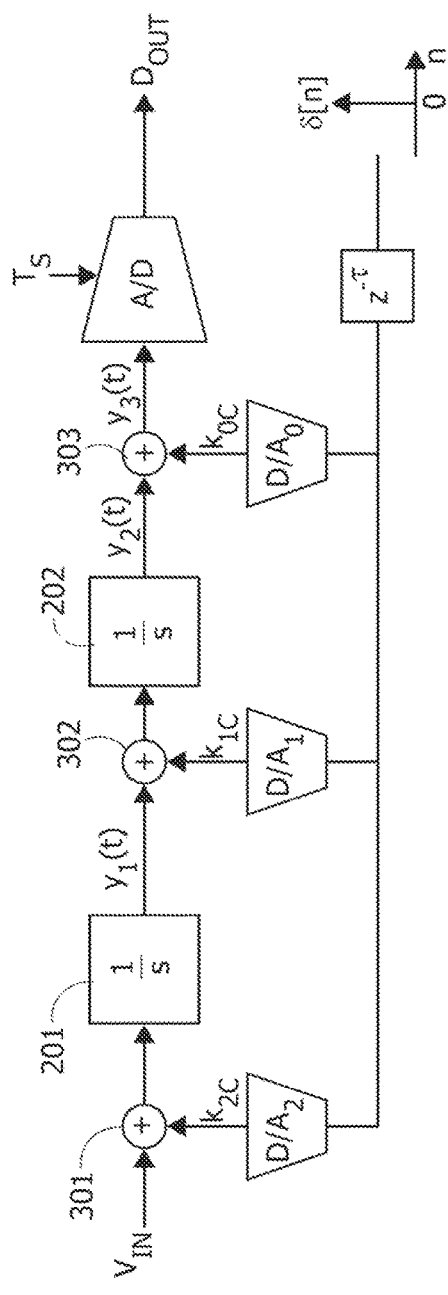
Figure 12A:
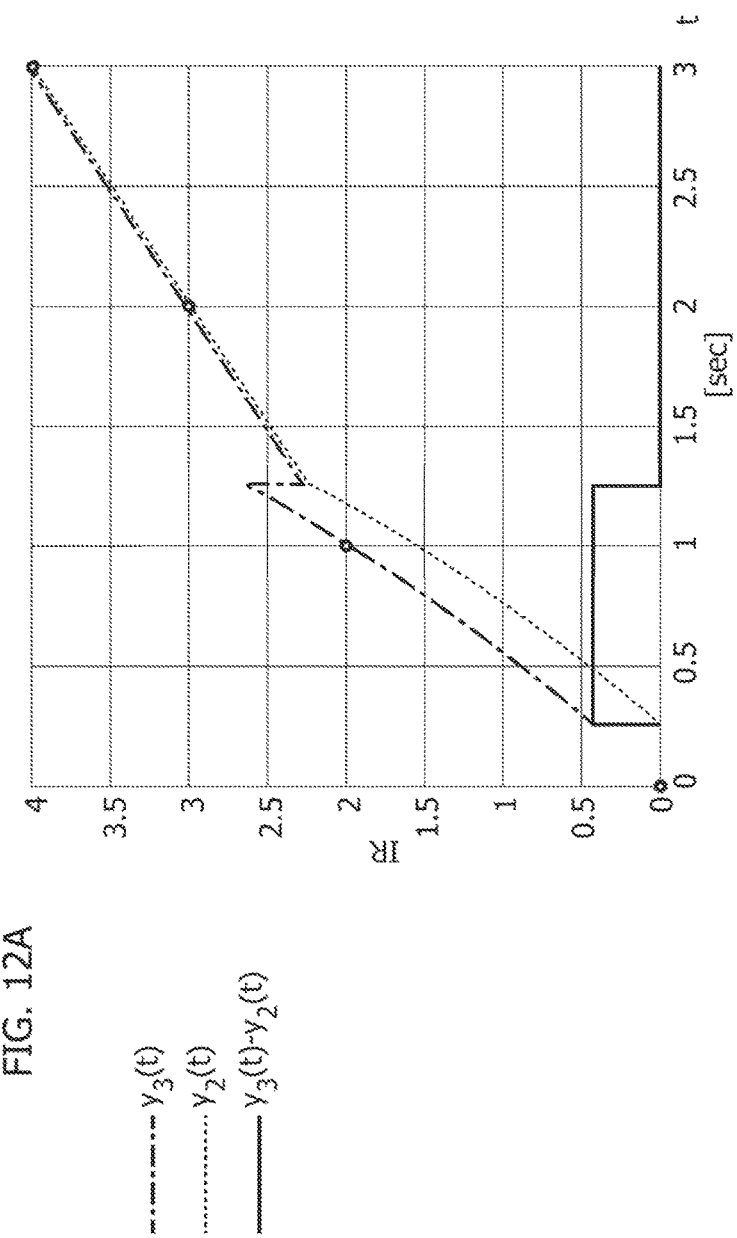
FIG. 12A is a diagram, similar to the diagrams of FIGS. 6 and 8, exemplary of possible ELD performance of a block diagram as exemplified in FIG. 12.

That situation, related to the circuit diagram of FIG. 12 (once more, parts or elements already discussed are indicated with like reference symbols, unless the context indicates otherwise, and are not described again for brevity) is pictured in the diagrams of FIG. 12A, where (by referring to the exemplary case of τ=0.25) behaviors over time t are portrayed for $y_3(t)$ (chain line), $y_2(t)$ (dashed line) and $y_3(t)-y_2(t)$ (continuous line), with sampled values at the sampling period $T_S$ again highlighted by dots.

Figure 13A:
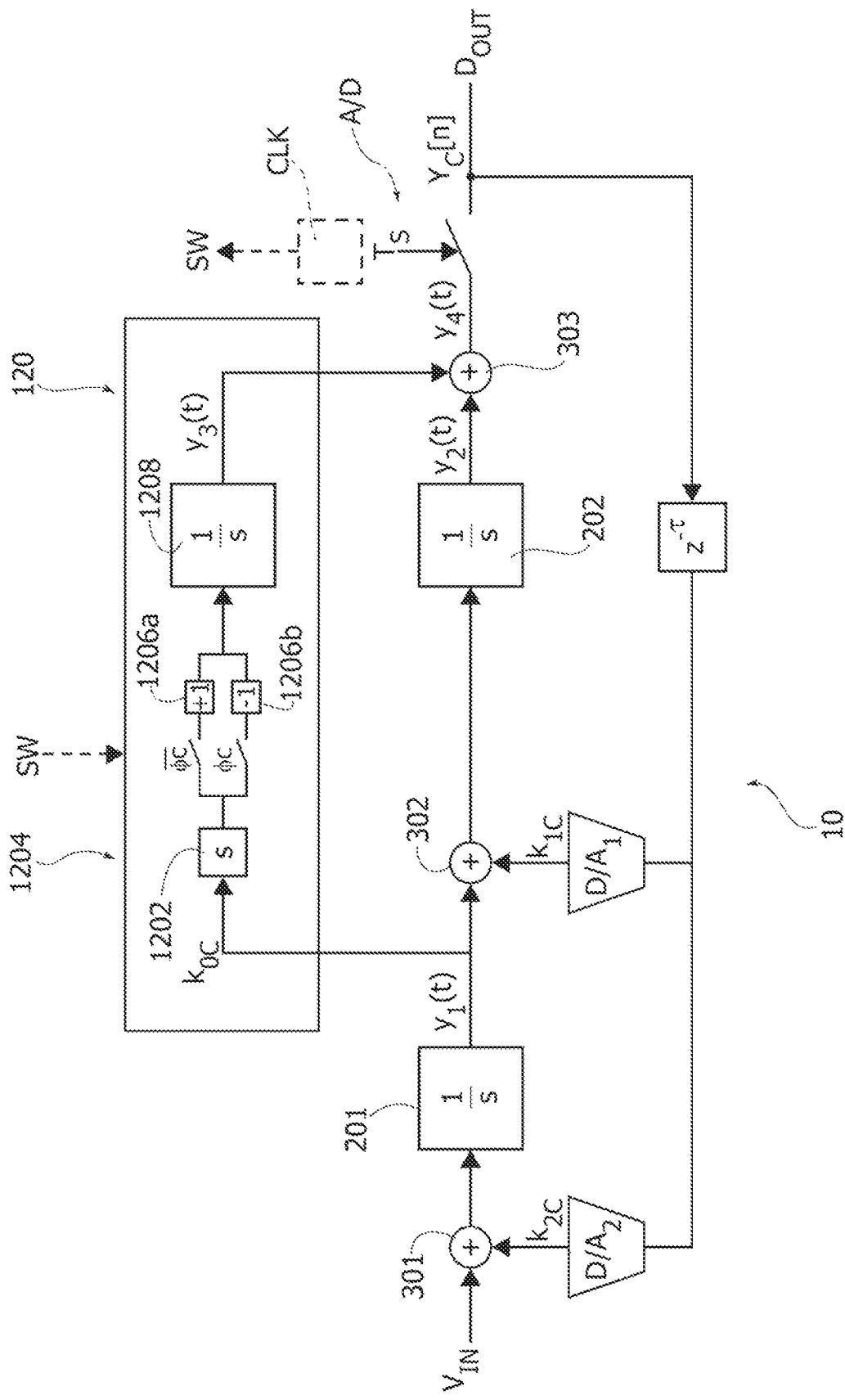
FIGS. 13A and 13B are block diagrams exemplary of embodiments as per the instant description.
Figure 13B:
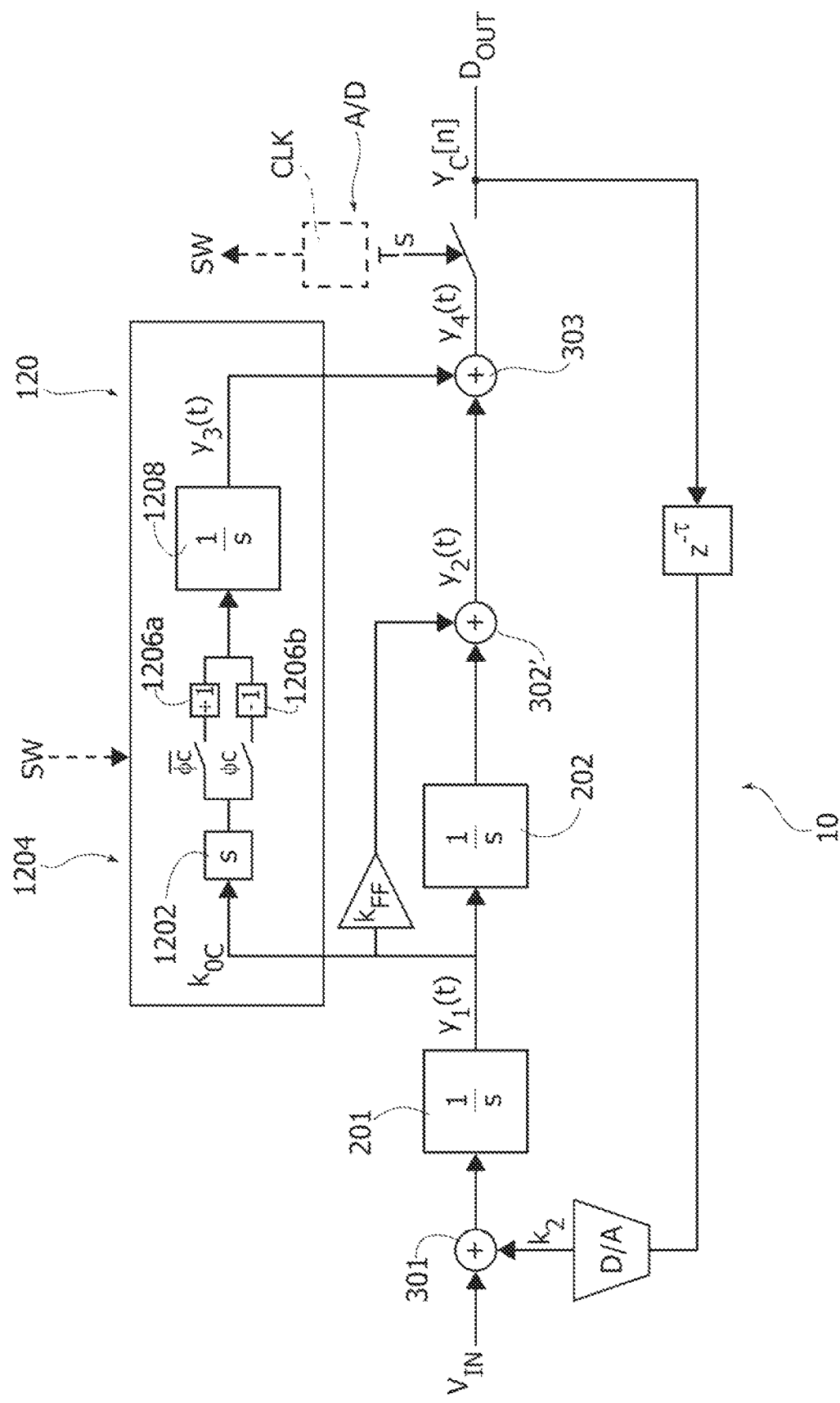

A corresponding compensation approach is exemplified by an ELD compensation network 120 represented in connection with both a multi-feedback architecture (FIG. 13A, which basically corresponds to FIGS. 2 and 3) and a single-feedback architecture (FIG. 13B, which basically corresponds to FIG. 11).

In both instances, parts or elements already discussed in connection with the previous figures are indicated with like reference symbols, unless the context indicates otherwise, and are not described again for brevity.

By way of recap, in FIG. 13A:

$V_{IN}$=(analog) input signal;

$y_1(t)$ =output from the first integrator (1/s) 201 supplied with the addition, obtained at the first adder node 301, of the input signal $V_{IN}$ and a feedback term from $D_{OUT}$ (affected by ELD as modelled by $z^{-\tau}$) obtained via the DAC D/A$_2$ multiplied by a coefficient $k_{2C}$ (for simplicity, this can be assumed to be included in the DAC); as discussed previously, the node 301 can be an adder node "with sign", where the feedback term obtained via the DAC D/A$_2$ weighed by $k_{2C}$ is in fact subtracted from the input signal $V_{IN}$ as conventional in a delta-sigma modulator;

$y_2(t)$=output from the second integrator (1/s) 202 supplied with the addition, obtained at the second adder node 302 (possibly with sign), of the output $y_1(t)$ from the first integrator 201 and a feedback term $D_{OUT}$ (again affected by ELD as modelled by $z^{-\tau}$) obtained via the DAC D/A$_1$ multiplied by a coefficient $k_{1C}$ (again for simplicity, this can be assumed to be included in the DAC);

Y_C[n]=modulator output D_OUT as obtained by sampling with a sampling period T_S a signal y_4(t) obtained by adding, at the adder node 303 (possibly with sign) at the output of the second integrator 202, the output y_2(t) from the second integrator 202 and an ELD compensation term y_3(t) provided by the ELD compensation network 120 as discussed in the following.

Similarly, in FIG. 13B:

V_IN=(analog) input signal;

y_1(t)=output from the first integrator (1/s) 201 supplied with the addition, obtained at the first adder node 301 (possibly with sign), of the input signal V_IN and a feedback term (affected by ELD as modeled by $z^{-\tau}$) obtained from D_OUT via a (single, in this case) DAC D/A multiplied by a coefficient k_2 (also in this case, the coefficient can be assumed to be included in the DAC);

y_2(t)=signal obtained at a second (feedforward) adder node 302' (possibly with sign) supplied with the output from the second integrator (1/s) 202 and the output y_1(t) from the first integrator 201 weighed by a term k_FF(via a respective weighing circuit of any known type);

Y_C[n]=modulator output obtained by sampling with a sampling period T_S a signal y_4(t) obtained by adding, at the adder node 303 (possibly with sign) coupled at the output of the second integrator 202 with the node 302' set there between, the output y_2(t) from the second adder node 302' and an ELD compensation term y_3(t) provided by the ELD compensation network 120 as discussed in the following.

In one or more embodiments, the ELD compensation network 120 can include (in both instances of FIG. 13A and FIG. 13B):

a derivative stage (s) 1202 supplied with the output y_1(t) from the first integrator 201 weighed by a coefficient k_0C (again, for simplicity, this can be assumed to be included in stage 1202);

a switch set 1204 (for instance, solid-state switches such as mosfet transistors) including two complementary switches ϕ_C(neg)—that is negated-ϕ_C—and ϕ_C. These switches being designated complementary indicates that the one is conductive when the other is non-conductive and vice-versa;

a pair of "sign" stages 1206a and 1206b labelled "+" and "−"; and a third integrator (1/s) 1208, which supplies the adder node 303 with a signal y_3(t) resulting from integrating the signal received from 1202 with different signs according to whether the output from 1202 is applied to the integrator input with the sign "+" (non-inverted at 1206a) or "−" (inverted at 1206b) as a function of the switching state of the "sign" stages 1206a and 1206b labelled "+" and "−" set between the switches ϕ_C(neg), ϕ_C, and the integrator 1208.

As discussed, the signal y_3(t) is intended to be added at 303 with y_2(t) in order to provide the signal y_4(t) which—once sampled at the sampling period T_S—yields the output Y_C[n].

As illustrated in FIGS. 13A and 13B, the switch arrangement 1204 can be operated under the control of a signal SW generated by a clock circuit CLK (of any type known to those of skill in the art). The circuit CLK can be a distinct element from the embodiments and can also be configured to provide the quantizer A/D with the sampling signal at the sampling period T_S to yield the output Y_C[n].

The diagrams of FIGS. 14A to 14E share a common time scale t (abscissa scale) and are exemplary of waveforms of signals which may occur in architectures as exemplified herein in the presence of a sampling signal at a period T_S (FIG. 14A) with ϕ_C(t) being a rectangular waveform having the same period T_S and 50% duty cycle.

Figure 14A:
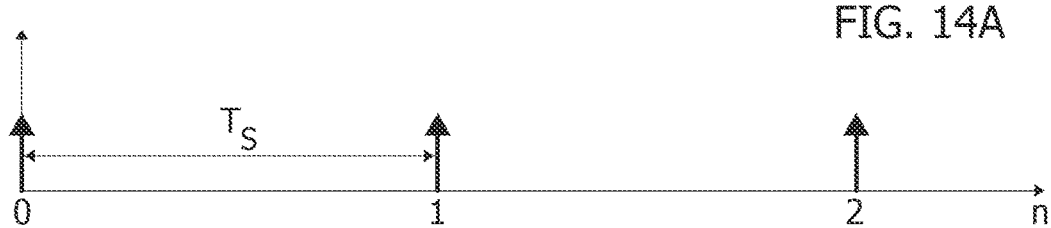
FIGS. 14A to 14E are diagrams exemplary of a possible time behavior of certain signals in embodiments as per the instant description.
Figure 14B:
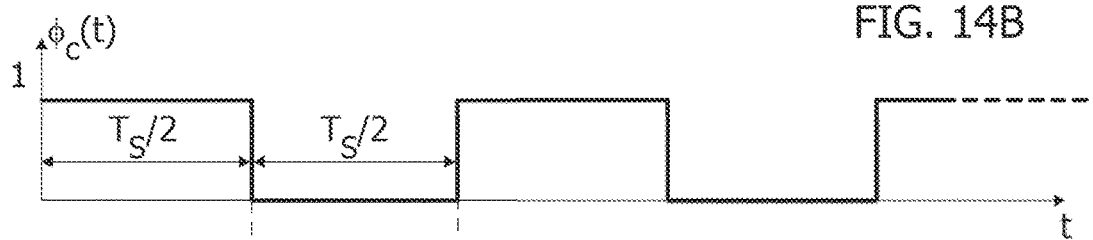
Figure 14C:
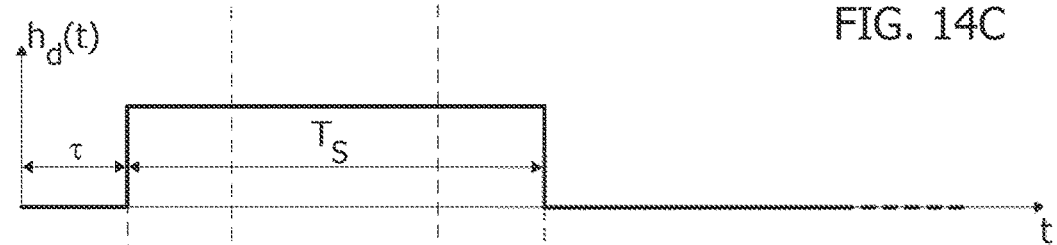

An exemplary waveform for ϕ_C(t) is shown in FIG. 14B: the time behavior of the complementary signal ϕ_C(neg), which is "low" when ϕ_C(t) is "high" and "high" when ϕ_C(t) is "low" is not expressly depicted for simplicity.

Again, an exemplary case of τ=0.25 (with T_S=1, in second units, for instance) can be referred to—with no limiting effect—in order to facilitate comparison with the previous discussion of conventional solutions.

Figure 14D:
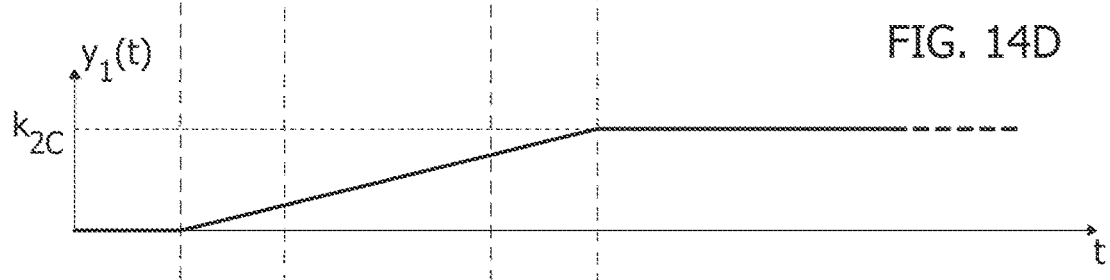

As discussed previously (see for instance FIG. 5), due to the action of ELD, an impulse on the circuit input will result in delayed integrator input (see FIG. 14C) which, in the case of the first integrator 201 will result in y_1(t) ramping up to k_2C (reference may be had first to the architecture of FIG. 13A for simplicity) as a ramp delayed by τ (see the exemplary diagram of FIG. 14D).

In the compensation network 120 this ramp is multiplied for a coefficient k_0C, then derived in the derivative stage (s) 1202 and integrated with a sign that depends on the "phase" represented by ϕ_C(t), whose period is given by T_S, which is synchronous with the quantizer sample phase and not afflicted by ELD.

Figure 14E:
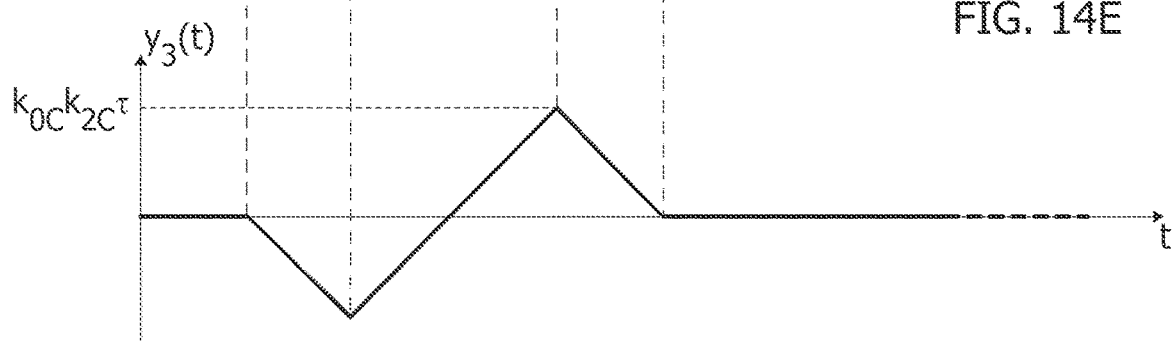

The resulting waveform at the sampling instants with period T_S, designated y_2C(nT_S)—see FIG. 14E, reaches a value whose value can be expresses as:

$$y_{2C}(nT_S) = \begin{cases} 0 & n = 0 \\ k_{0C}k_{2C}\tau & n = 1 \\ 0 & n \geq 2 \end{cases} \quad (2)$$

The contribution of this compensation network to the output signal to the quantizer A/D (see y_3(t) in the exemplary diagram of FIG. 14E) has the same behavior of a signal from a direct-feedback loop proposed in conventional ELD compensation as described previously (see FIGS. 7 and 12, for instance) and is non null (non-zero) only at the first sampling instant.

Figure 15:
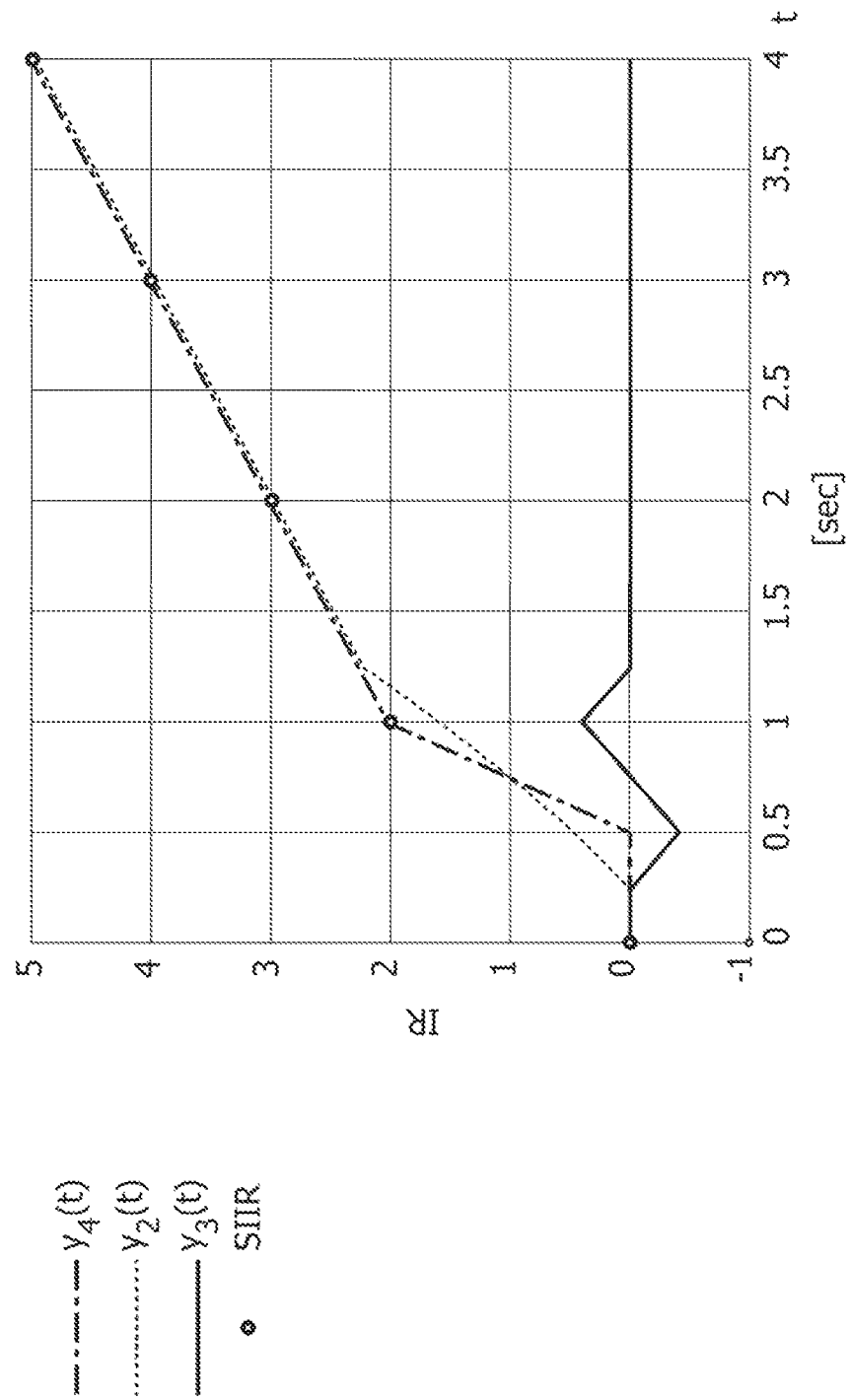
FIG. 15 is a diagram, similar to the diagrams of FIGS. 6, 8 and 12A, exemplary of possible ELD performance of a block diagram as exemplified in FIG. 13A.

The complete impulse response of such compensated modulator and the different compensation contributions are shown in the diagram of FIG. 15, where behaviors over time t are portrayed for y_4(t) (chain line), y_2(t) (dashed line) and y_3(t) (continuous line), with sample values at a period T_S again highlighted by dots.

It will be appreciated that the previous discussion also extends to the architecture of FIG. 13B, which can be regarded as a sort of simplified version of the architecture of FIG. 13A where the feedback loop through D/A_1 with the coefficient k_1C is removed and system stability is achieved introducing the feedforward path, from the output of the first integrator 201 to the summing node 303, weighed for the coefficient k_FF.

Figure 16A:
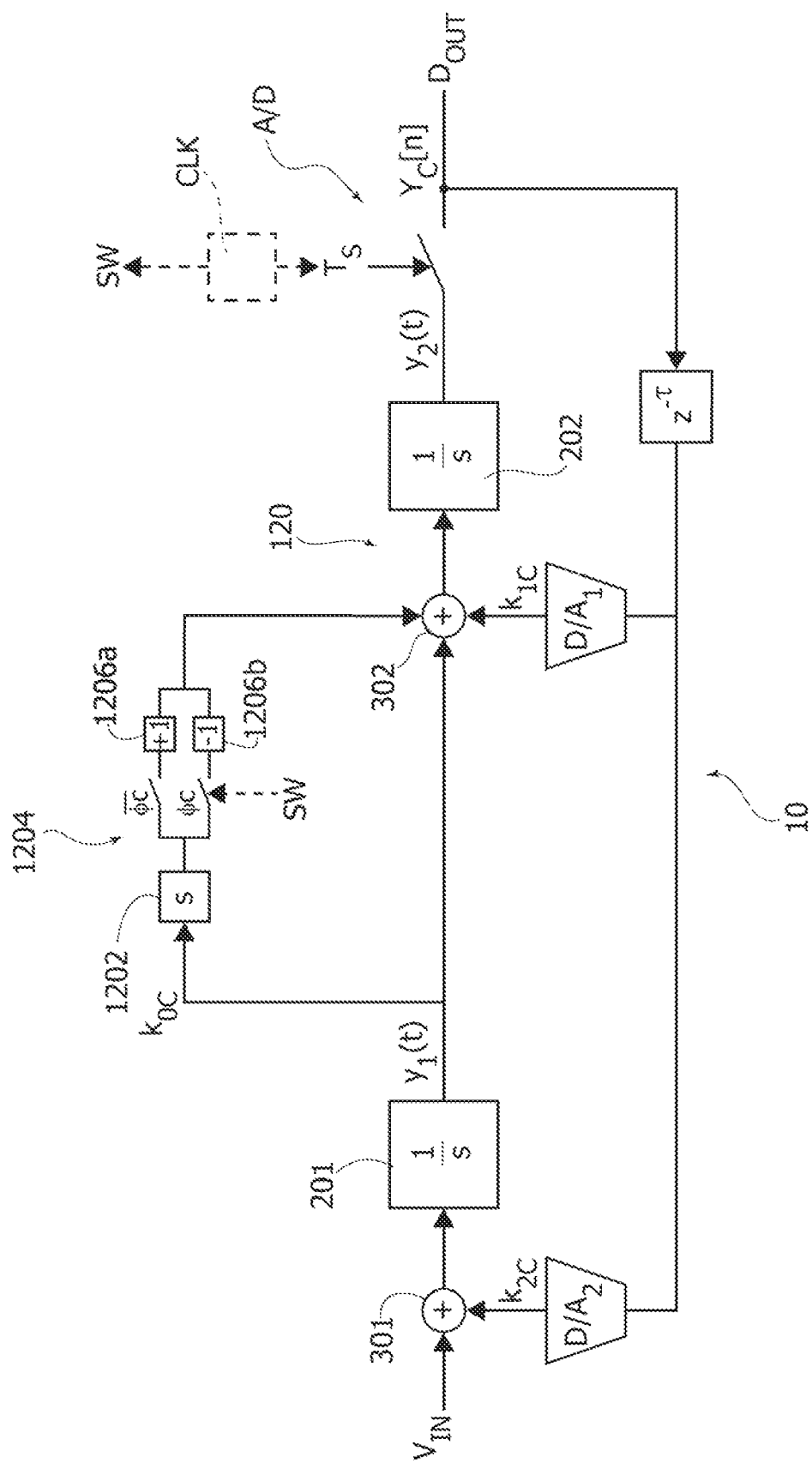
FIGS. 16A and 16B are block diagrams exemplary of possible embodiments as per the instant description.
Figure 16B:
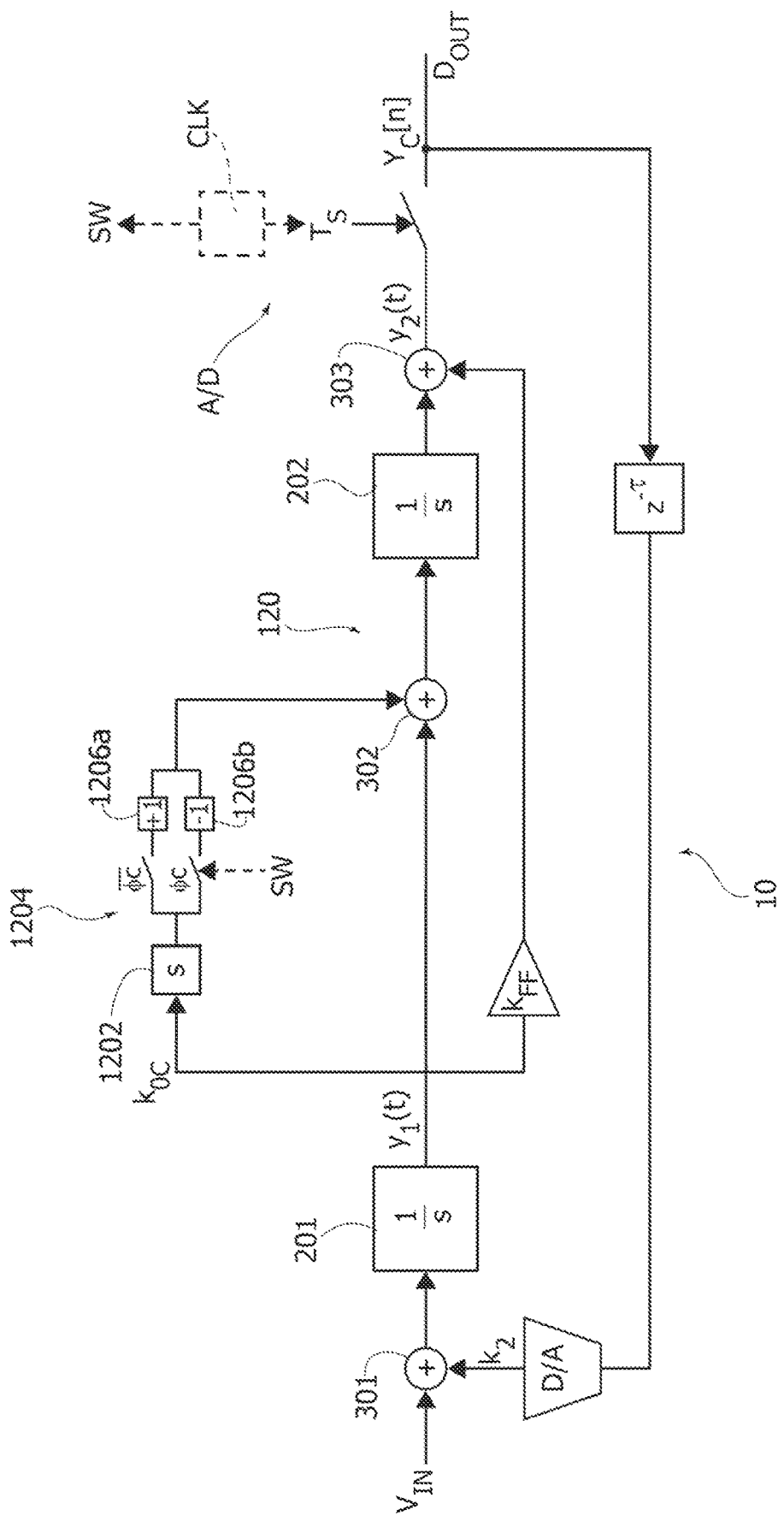

The block diagrams of FIGS. 13A and 13B can be modified (simplified) as illustrated in FIGS. 16A and 16B, where same integrator circuit (that is a same component) can be used as the second integrator 202 of the loop filter and as integrator 1208 of the ELD compensation network 120.

In fact:

in FIG. 13A, the signals from the node 302 and from the "sign reversal" arrangement 1204, 1206a, 1206b in the ELD compensation network 120 are distinctly applied to the integrators 202 and 1208 and then added at the node 303; in FIG. 16A, the signal from the "sign reversal" arrangement 1204, 1206a, 1206b in the ELD compensation network 120 is merely added to the combination (as provided at the node 302) of the signal $y_1(t)$ from the first integrator 201 and the feedback signal from D/A$_1$ weighed by $k_{1C}$, with the three signals thus combined at 302 supplied to the integrator 202 (acting as a "common" loop/compensation integrator) thus dispensing with one integrator circuit and the adder node 303 at the output of the integrator 202 as shown in FIG. 13A; and in FIG. 13B, the signals from the first integrator 201 and from the "sign reversal" arrangement 1204, 1206a, 1206b in the ELD compensation network 120 are again distinctly applied to the integrators 202 and 1208 and then added at the node 303 together with the feedforward term $K_{FF}*y_1(t)$ added at 302'' to the output from the first integrator 201; in FIG. 16B, the signals from the first integrator 201 and from the "sign reversal" arrangement 1204, 1206a, 1206b in the ELD compensation network 120 are merely added 302 with the two signals thus combined supplied to the integrator 202 (again acting as a "common" loop/compensation integrator) while the feedforward term $K_{FF}*y_1(t)$ is added at the adder node 303 at the output of the integrator 202, thus again dispensing with one integrator circuit in comparison with FIG. 13B.

The block-scheme description of one or more embodiments as discussed in the foregoing lends itself to a fairly simple implementation in a fully differential architecture.

Figure 17:
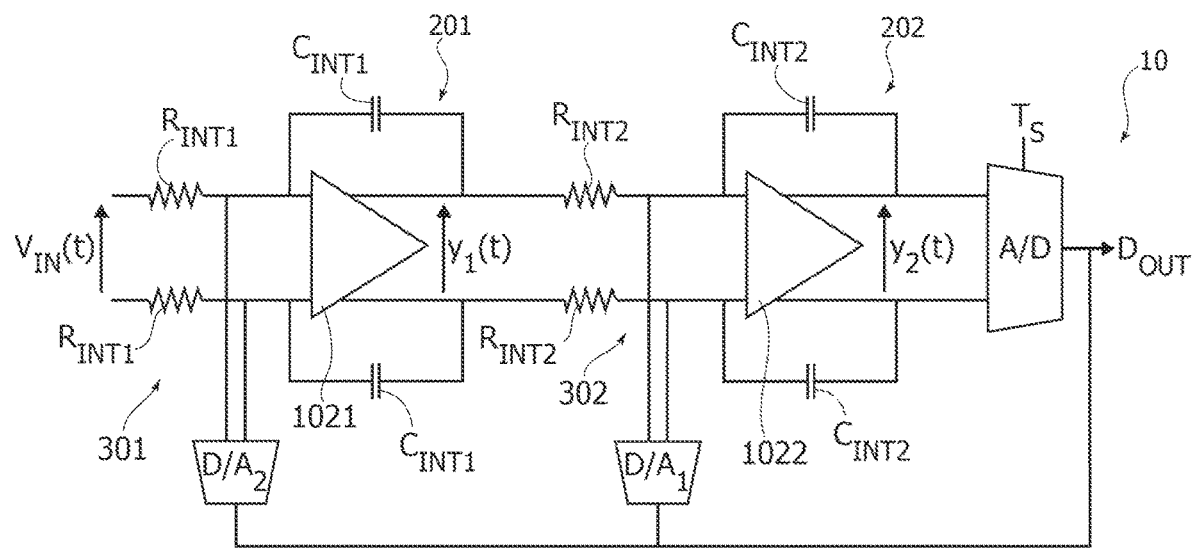
FIGS. 17 and 18 are circuit diagrams exemplary of possible implementation of embodiments.

For instance, the block diagram of FIG. 17 is exemplary of a possible practical implementation of a second order CTDSM along the lines of FIG. 2 (that is, with no ELD compensation provided).

While the (otherwise conventional) architecture of the DAC elements D/A$_1$ and D/A$_2$ is not detailed for simplicity in FIG. 17, an exemplary active-RC (fully differential) topology is exemplified for the continuous-time integrators 201, 202 generating $y_1(t)$ and $y_2(t)$ and the associated adder nodes 301, 302. The (digital) output signal $D_{OUT}$ is exemplified as derived at the output of a quantizer A/D controlled by a sampling signal of period $T_S$ (see the rightmost portion of FIGS. 13A and 13B for immediate reference).

As exemplified in FIG. 17, a differential topology for the continuous-time integrators 201, 202 may comprise two fully differential amplifiers 1021, 1022 (of any type known to those of skill in the art, OpAmps, for instance) with respective RC feedback loops $R_{INT1}$, $C_{INT1}$ and $R_{INT2}$, $C_{INT2}$. As exemplified in FIG. 17, the feedback inputs from D/A$_1$ and D/A$_2$ can be implemented as differential inputs to the (likewise differential) input ports to the fully differential amplifiers 1021, 1022.

Figure 18:
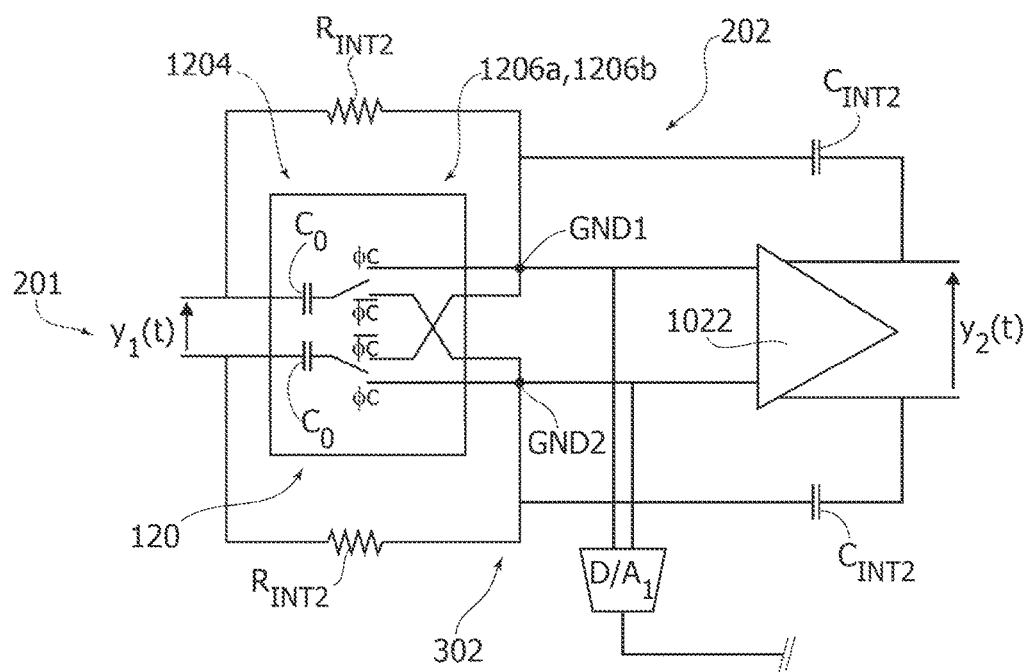

As exemplified in FIG. 18, a compensation network 120 as discussed in the foregoing can be associated with a fully differential amplifier 1022 included in a circuit layout as exemplified in FIG. 17.

In one or more embodiments, this may include coupling two capacitances $C_0$ intermediate:
the terminals of the resistors $R_{INT_2}$ which receive therebetween the (differential) output $y_1(t)$ from the first integrator 201 (fully differential amplifier 1021 in FIG. 17); and
the virtual ground of the second integrator 202 (fully differential amplifier 1022 in FIG. 17), namely the intermediate nodes GND1, GND2 between $R_{INT2}$ and $C_{INT2}$ which receive applied therebetween the (differential) feedback signal from the DAC D/A$_1$.

Coupling of the two capacitances $C_0$ to the virtual ground GND1, GND2 of the second integrator 202 can be through four switches whose state depends on the "phase" signal $\phi_C$ with these switches (solid-state switches such a mosfet transistors, for instance) configured to couple the two capacitances $C_0$ to the virtual ground of the second integrator 202 in a "crossed" arrangement.

In that way, four switches labeled $\phi_C$ and $\phi_C$(neg) can implement the functions exemplified as 1204 and 1206a, 1206b in FIG. 16A, that is:
with $\phi_C$(neg) "low" and $\phi_C$ "high", the signal $y_1(t)$ is applied with the same polarity (with no sign reversal: see 1206a in FIG. 16A) between the intermediate nodes between $R_{INT2}$ and $C_{INT2}$; and
with $\phi_C$(neg) "high" and $\phi_C$ "low", the signal $y_1(t)$ is applied with reversed polarity (with sign reversal: see 1206b in FIG. 16A) between the intermediate nodes between $R_{INT2}$ and $C_{INT2}$.

It is noted that the current flowing through the capacitances $C_0$ is a function of (equal to, for instance) the first derivative of the output signal $y_1(t)$ from the first integrator 201 multiplied by the capacitance value.

In that way, a circuit arrangement as exemplified in FIG. 18 can also provide the derivative stage 1202.

This current is injected in the virtual ground of the second integrator 202 with a sign that depends on the "phase" signal $\phi_C$ (which can be derived from CLK together with the sampling signal of period $T_S$ in a manner known to those of skill in the art) and integrated using the second integrator feedback capacitances $C_{INT2}$.

The resulting coefficient $k_{0_C}$ can be expressed as:

$$k_{0_C} = C_0/C_{INT2}.$$

It will be appreciated that, while discussed for simplicity in connection with the block diagram of FIG. 16A, the implementation exemplified in FIG. 18 is suited to be also applied, for instance, to the block diagram of FIG. 16B, where the DAC D/A1 has been removed and the feedforward path $K_{FF}$ can be implemented using known techniques to those skilled in the art.

As discussed, one or more embodiments as exemplified herein in connection with a second-order layout (two integrators 201, 202) can be applied also to higher order (higher-than-two) modulators introducing a compensation network 120 as exemplified here in between:
the first integrator (that is, the integrator—here the integrator 201—coupled to the input node $V_{IN}$); and
the virtual ground of the last (the n-th in a n-th order scheme) integrator before the quantizer A/D (that is, the integrator—here the integrator 202—providing the signal to be sampled with period $T_S$), the contribution to the impulse response being also in that case the same presented here for a 2-nd order modulator.

A circuit (for instance, 10) as exemplified herein may comprise:
an input node (for instance, $V_{IN}$) configured to receive an analog input signal;
a quantizer circuit (for instance, A/D) having an output node (for instance, $D_{OUT}$), the quantizer circuit operable at a certain sampling period (for instance, $T_S$) to provide at said output node a digital signal resulting from analog-to-digital conversion of the analog input signal at said input node;
a first integrator circuit (for instance, 201) in a signal propagation path (201, 302, 202, 303—FIG. 13A; 201, 202, 302'', 303—FIG. 13B; 201, 302, 202—FIG. 16A; 201, 302, 202, 303 FIG. 16B) from the input node to the quantizer circuit, the first integrator circuit (201) having an input (for instance, 301) coupled to the input node to receive said analog input signal therefrom;

a feedback network (for instance, D/A$_1$, D/A$_2$; D/A) sensitive to the digital signal at said output node, the feedback network comprising at least one digital-to-analog converter (for instance, D/A$_2$ FIGS. 13A and 16A; D/A FIGS. 13B and 16B) configured to inject into the input of the first integrator circuit (201) a weighed (for instance, k$_{2C}$; k$_2$) analog-converted replica of said digital output signal, wherein said first integrator circuit propagates over said signal propagation path towards the quantizer circuit an integrated signal (for instance, y$_1$(t)) which is a function of said analog input signal and said weighed analog-converted replica of said digital output signal;

an excess delay loop (for instance, $z^{-\tau}$) compensation network (for instance, 120) comprising a derivative circuit (for instance, 1202, possibly comprising capacitances C$_0$ as exemplified in FIG. 18) configured to receive a weighed (for instance, k$_{0C}$) replica of said integrated signal from the first integrator circuit and produce therefrom a derivative signal as well as a sign-reversal circuit (for instance, 1204, 1206a, 1206b, possibly comprising switches $\phi_C$, $\phi_C$(neg)) configured to alternately reverse the sign of said derivative signal over subsequent time intervals of a duration half (for instance, T$_S$/2) said certain sampling period (see, for instance, FIG. 14B, showing sign being "+" for T$_S$/2, then "−" for T$_S$/2, then again "+" for T$_S$/2, "−" for T$_S$/2, "+" for T$_S$/2 and so on);

at least one further integrator circuit (for instance: 1208 in FIGS. 13A and 13B; 202 in FIGS. 16A and 16B) configured to integrate said derivative signal having the sign thereof alternately reversed over said subsequent time intervals of a duration half said certain sampling period, an excess delay loop compensation node (for instance: 303 in FIGS. 13A and 13B; 302 in FIGS. 16A and 16B) configured to inject into said signal propagation path towards the quantizer circuit (A/D) an excess delay loop compensation signal, wherein:

i) (as exemplified in FIGS. 13A and 13B) said excess delay loop compensation node (for instance, 303) is arranged at an output of said at least one further integrator circuit (for instance, 1208) and is configured to inject into said signal propagation path towards the quantizer circuit said derivative signal having the sign thereof alternately reversed over said subsequent time intervals of a duration half said certain sampling period after integration of said derivative signal at said at least one further integrator circuit (for instance, 1208), or ii) (as exemplified in FIGS. 16A and 16B) said excess delay loop compensation node (for instance, 302) is arranged at an input of said at least one further integrator circuit (for instance, 202) and is configured to inject into said signal propagation path towards the quantizer circuit said derivative signal having the sign thereof alternately reversed over said subsequent time intervals of a duration half said certain sampling period before integration of said derivative signal at said at least one further integrator circuit (for instance, 202).

As discussed previously, in one or more embodiments, the at least one further integrator circuit as exemplified here by 202 may be the n-th integrator circuit in a cascaded arrangement of n integrator circuits in a n-th order loop.

A circuit as exemplified herein (see FIGS. 13A and 13B) may comprise:

a first further integrator circuit (for instance, 1208) arranged intermediate said sign-reversal circuit (for instance, 1204, 1206a, 1206b, $\phi_C$, $\phi_C$(neg)) and said excess delay loop compensation node (for instance, 303); and a second further integrator circuit (for instance, 202) arranged intermediate said first integrator circuit and said excess delay loop compensation node (for instance, 303), wherein said derivative signal having the sign thereof alternately reversed over said subsequent time intervals of a duration half said certain sampling period is injected after integration at said first further integrator circuit (for instance, 1208) into said signal propagation path towards the quantizer circuit downstream of said second further integrator circuit (for instance, 202).

In a circuit as exemplified herein (see FIG. 13A) said feedback network sensitive to the digital signal at said output node may comprises at least one further digital-to-analog converter (for instance, D/A$_1$) configured to inject into said signal propagation path towards the quantizer circuit intermediate said first integrator circuit (for instance, 201) and said second further integrator circuit (for instance, 202) at least one further weighed (for instance, k$_{1C}$) analog-converted replica of said digital output signal.

A circuit as exemplified herein (see FIG. 13B) may comprise a feedforward signal path (for instance, k$_{FF}$) coupled to said first integrator circuit to receive therefrom said integrated signal, the feedforward signal path configured to inject (for instance, 302") a weighed replica of said integrated signal into said signal propagation path towards the quantizer circuit intermediate said second further integrator circuit (for instance, 202) and said quantizer circuit.

A circuit as exemplified herein (see FIGS. 16A and 16B) may comprise said at least one further integrator circuit (for instance, 202) arranged intermediate said excess delay loop compensation node (for instance, 302) and said quantizer circuit wherein said derivative signal having the sign thereof alternately reversed over said subsequent time intervals of a duration half said certain sampling period is injected into said signal propagation path towards the quantizer circuit upstream of said at least one further integrator circuit (for instance, 202).

In a circuit as exemplified herein (see FIG. 16A), said feedback network sensitive to the digital signal at said output node may comprises at least one further digital-to-analog converter (for instance, D/A$_1$) configured to inject into said signal propagation path towards the quantizer circuit intermediate said first integrator circuit (for instance, 201) and said at least one further integrator circuit (for instance, 202) at least one further weighed (for instance, k$_{1C}$) analog-converted replica of said digital output signal.

A circuit as exemplified herein (see FIG. 16B) may comprise a feedforward signal path (for instance, k$_{FF}$) coupled to said first integrator circuit to receive therefrom said integrated signal, the feedforward signal path configured to inject (for instance, 303) a weighed replica of said integrated signal into said signal propagation path towards the quantizer circuit intermediate said at least one further integrator circuit (for instance, 202) and said quantizer circuit.

In a circuit as exemplified herein, said first integrator circuit may comprise a fully differential amplifier (for instance, 1021 in FIG. 17) having differential input node terminals (for instance, 301, R$_{INT1}$) and differential output node terminals (for instance, to provide $y_1(t)$ therebetween) with RC feedback networks (for instance, $R_{INT1}$, $C_{INT1}$) from said differential output node terminals to said differential input node terminals.

In a circuit as exemplified herein (see FIG. 18) said at least one further integrator circuit (for instance, 202, but might be also 1208) may comprise a fully differential amplifier (for instance, 1022) having differential input node terminals (for instance, $R_{INT2}$) and differential input node terminals (for instance, to provide $y_2(t)$ therebetween) with RC feedback networks (for instance, $R_{INT2}$, $C_{INT2}$) from said differential output node terminals to said differential input node terminals, wherein said RC feedback networks provide virtual ground nodes (for instance, GND1, GND2) of said further integrator circuit, said differential output node terminals of said first integrator circuit (for instance, 201) are coupled to said virtual ground nodes in said further integrator circuit via respective capacitances (for instance, $C_0$) providing said derivative circuit and via sign-reversal circuitry (for instance, $\phi_C$, $\phi_C(neg)$) configured to alternately reverse over subsequent time intervals of a duration half said certain sampling period the polarity of coupling said respective capacitances to said virtual ground nodes in said at least one further integrator circuit, that is with:

the first capacitance $C_0$ in the pair coupled to GN1 for $T_S/2$, then to GN2 for $T_S/2$, then again to GN1 for $T_S/2$, to GN2 for $T_S/2$, and so on, and, in a complementary way; and the second capacitance Coin the pair coupled to GN2 for $T_S/2$, then to GN1 for $T_S/2$, then again to GN2 for $T_S/2$, to GN1 for $T_S/2$, and so on).

A delta-sigma modulator device as exemplified herein may comprise a circuit as exemplified herein, the delta-sigma modulator device configured to receive an continuous analog input signal at said input node and to provide at said output node a delta-sigma modulated digital signal resulting from delta-sigma analog-to-digital conversion of the analog input signal at said input node.

As exemplified herein a method of providing at an output node a digital signal resulting from analog-to-digital conversion of an analog input signal supplied to an input node may comprise:

supplying said analog input signal to said input node;

providing said digital signal to said output node via a quantizer circuit operated at a certain sampling period;

providing a signal propagation path from the input node to the quantizer circuit said signal propagation path comprising a first integrator circuit having an input coupled to the input node to receive said analog input signal therefrom;

providing a feedback network sensitive to the digital signal at said output node, the feedback network comprising at least one digital-to-analog converter configured to inject into the input of the first integrator circuit a weighed analog-converted replica of said digital output signal, wherein said first integrator circuit propagates over said signal propagation path towards the quantizer circuit an integrated signal which is a function of said analog input signal and said weighed analog-converted replica of said digital output signal;

receiving said integrated signal from said at least one integrator circuit at a derivative circuit configured to produce therefrom a derivative signal and alternately reversing the sign of said derivative signal over subsequent time intervals of a duration half said certain sampling period;

providing at least one further integrator circuit configured to integrate said derivative signal having the sign thereof alternately reversed over said subsequent time intervals of a duration half said certain sampling period; injecting into said signal propagation path towards the quantizer circuit an excess delay loop ($z^{-\tau}$) compensation signal, wherein said injecting comprises:

i) as exemplified in FIGS. 13A and 13B—injecting into said signal propagation path towards the quantizer circuit said derivative signal having the sign thereof alternately reversed over said subsequent time intervals of a duration half said certain sampling period after integration of said derivative signal at said at least one further integrator circuit; or ii) as exemplified in FIGS. 16A and 16B—injecting into said signal propagation path towards the quantizer circuit said derivative signal having the sign thereof alternately reversed over said subsequent time intervals of a duration half said certain sampling period before integration of said derivative signal at said at least one further integrator circuit.

The details and embodiments may vary with respect to what has been disclosed herein merely by way of example without departing from the extent of protection.

The extent of protection is determined by the annexed claims.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
an analog signal input, which, in operation, receives an analog input signal; and
a delta-sigma modulation circuit having a sampling period and coupled to the analog signal input, wherein the delta-sigma modulation circuit, in operation, generates a delta-sigma modulated signal based on the analog input signal, the delta-sigma modulation circuit including:
a modulated signal output, which, in operation, outputs the delta-sigma modulated signal;
a first integrator;
an analog-to-digital converter coupled to the modulated signal output;
a feedback-loop coupled between the modulated signal output and an input of the first integrator;
a second integrator coupled between the first integrator and the analog-to-digital converter; and
loop-delay compensation circuitry having a plurality of switches, wherein the loop delay compensation circuitry, in operation, controls the plurality of switches based on a time interval of a duration of half the sampling period and generates a loop-delay compensation signal.

2. The device of claim 1, wherein the loop-delay compensation circuitry includes a derivative circuit coupled between an output of the first integrator and the plurality of switches.

3. The device of claim 2, wherein the loop-delay compensation circuitry comprises a third integrator coupled to an output of the plurality of switches.

4. The device of claim 3, wherein,
the feedback-loop includes:
a first adder having a first input coupled to the analog signal input and an output coupled to an input of the first integrator;
a first digital-to-analog converter coupled between the modulated signal output and a second input of the first adder;
a second adder having a first input coupled to an output of the first integrator and an output coupled to an input of the second integrator; and
a second digital-to-analog converter coupled between the modulated signal output and a second input of the second adder; and
the loop-delay compensation circuitry comprises a third adder having a first input coupled to an output of the second integrator, a second input coupled to an output of the third integrator and an output coupled to the analog-to-digital converter.

5. The device of 4 claim, wherein,
the first digital-to-analog converter, in operation, generates a first weighted feedback signal; and
the second digital-to-analog converter, in operation, generates a second weighted feedback signal.

6. The device of claim 3, wherein,
the feedback-loop includes:
a first adder having a first input coupled to the analog signal input and an output coupled to an input of the first integrator; and
a first digital-to-analog converter coupled between the modulated signal output and a second input of the first adder; and
the loop-delay compensation circuitry comprises a second adder having a first input coupled to an output of the second integrator, a second input coupled to an output of the third integrator and an output coupled to the analog-to-digital converter.

7. The device of claim 6, wherein,
the first digital-to-analog converter, in operation, generates a first weighted feedback signal.

8. The device of claim 6, wherein,
the delta-sigma modulation circuit includes a third adder coupled between the output of the second integrator and the second adder, the third adder having a first input coupled to an output of the first integrator, a second input coupled to the output of the second integrator and an output coupled to the first input of the second adder.

9. The device of claim 8 wherein the delta-sigma modulation circuit comprises an inverter coupled between the output of the first integrator and the first input of the third adder.

10. The device of claim 2, wherein,
the feedback-loop includes:
a first adder having a first input coupled to the analog signal input and an output coupled to an input of the first integrator;
a first digital-to-analog converter coupled between the modulated signal output and a second input of the first adder;
a second adder having a first input coupled to an output of the first integrator and an output coupled to an input of the second integrator; and
a second digital-to-analog converter coupled between the modulated signal output and a second input of the second adder; and
an output of the loop-delay compensation circuitry is coupled to a third input of the second adder.

11. The device of claim 10, wherein,
the first digital-to-analog converter, in operation, generates a first weighted feedback signal; and
the second digital-to-analog converter, in operation, generates a second weighted feedback signal.

12. The device of claim 2, wherein,
the feedback-loop includes:
a first adder having a first input coupled to the analog signal input and an output coupled to an input of the first integrator; and
a first digital-to-analog converter coupled between the modulated signal output and a second input of the first adder; and
the delta-sigma modulation circuit includes:
a second adder having a first input coupled to an output of the first integrator, a second input coupled to an output of the loop-delay compensation circuitry, and an output coupled to the second integrator; and
a third adder having a first input coupled to an output of the first integrator, a second input coupled to an output of the second integrator and an output coupled to the analog-to-digital converter.

13. The device of claim 12, wherein,
the first digital-to-analog converter, in operation, generates a first weighted feedback signal.

14. The device of claim 12, wherein, the delta-sigma modulation circuit comprises an inverter coupled between the output of the first integrator and the first input of the third adder.

15. The device of claim 2, wherein,
the first integrator comprises a first differential amplifier; and
the second integrator comprises a second differential amplifier.

16. The device of claim 15, wherein the first differential amplifier has differential input node terminals and differential output node terminals with resistor/capacitor (RC) feedback networks coupled between the differential output node terminals and the differential input node terminals.

17. The device of claim 16, wherein
the second differential amplifier has differential input node terminals and differential output node terminals with RC feedback networks coupled between the differential output node terminals and the differential input node terminals, wherein the RC feedback networks of the second differential amplifier, in operation, provide virtual ground nodes; and
the differential output node terminals of the first differential amplifier are coupled to the virtual ground nodes of the second differential amplifier via respective capacitances and switches of the plurality of switching circuits.

18. A method, comprising:
receiving an analog input signal; and
generating a digital delta-sigma modulated signal using a sampling period, wherein the generating the digital delta-sigma modulated signal includes:
generating a feed-back signal based on the digital delta-sigma modulated signal;

combining the feedback signal with the analog input signal, generating a difference signal;

integrating the difference signal;

generating a loop-delay compensation signal based on the integrated signal by controlling a plurality of switches based on a time interval of a duration of half the sampling period; and generating an intermediate signal based on the integrated signal and the loop-delay compensation signal; and sampling the intermediate signal using the sampling period, generating the digital delta-sigma modulated signal.

19. The method of claim 18 wherein generating the loop-delay compensation signal includes generating a derivative of the integrated difference signal.

20. The method of claim 19, comprising:

generating a second feed-back signal based on the digital delta-sigma modulated signal; and combining the second feedback signal with integrated difference signal;

integrating the combined second feedback signal and integrated difference signal, generating a second intermediate signal; and generating the intermediate signal by combining the second intermediate signal and the loop-delay compensation signal.

21. The method of claim 19, comprising:

integrating the integrated difference signal, generating a second integrated signal;

combining the integrated difference signal and the second integrated signal, generating a second intermediate signal; and combining the second intermediate signal and the loop-delay compensation signal, generating the intermediate signal.

22. The method of claim 19, comprising:

generating a second feed-back signal based on the digital delta-sigma modulated signal;

combining the second feedback signal with integrated difference signal and the loop-delay compensation signal, generating a second intermediate signal; and generating the intermediate signal by integrating the second intermediate signal.

23. The method of claim 19, comprising:

combining the integrated difference signal and the loop-delay compensation signal;

integrating the combined integrated difference signal and loop-delay compensation signal, generating a second intermediate signal; and generating the intermediate signal by combining the second intermediate signal and the integrated difference signal.

24. The method of claim 18, comprising:

integrating the difference signal using a first differential amplifier;

generating a second feed-back signal based on the digital delta-sigma modulated signal;

generating a second intermediate signal based on the integrated difference signal, the loop-delay compensation signal and the second feed-back signal; and generating the intermediate signal by integrating the second intermediate signal using a second differential amplifier.

* * * * *